United States Patent
Ishikawa et al.

(10) Patent No.: US 7,911,861 B2
(45) Date of Patent: Mar. 22, 2011

(54) SEMICONDUCTOR MEMORY DEVICE AND METHOD OF TESTING SEMICONDUCTOR MEMORY DEVICE

(75) Inventors: Toru Ishikawa, Chuo-ku (JP); Shotaro Kobayashi, Chuo-ku (JP)

(73) Assignee: Elpida Memory, Inc., Tokyo (JP)

(*) Notice: Subject to any disclaimer, the term of this patent is extended or adjusted under 35 U.S.C. 154(b) by 167 days.

(21) Appl. No.: 12/260,842

(22) Filed: Oct. 29, 2008

(65) Prior Publication Data

US 2009/0296504 A1 Dec. 3, 2009

(30) Foreign Application Priority Data

May 30, 2008 (JP) ................................ 2008-143580

(51) Int. Cl.
*G11C 7/00* (2006.01)
(52) U.S. Cl. ...................... 365/201; 365/233.1; 365/194; 365/233.12
(58) Field of Classification Search .................. 365/201, 365/233.1, 194, 233.12; 711/167, 154; 714/718–719
See application file for complete search history.

(56) References Cited

U.S. PATENT DOCUMENTS 6,671,787 B2 * 12/2003 Kanda et al. .................. 711/167
7,590,016 B2 * 9/2009 Ishikawa et al. .............. 365/201

FOREIGN PATENT DOCUMENTS

JP 2007-317016 A 12/2007

* cited by examiner

*Primary Examiner* — David Lam
(74) *Attorney, Agent, or Firm* — Sughrue Mion, PLLC

(57) ABSTRACT

A semiconductor memory device may include a memory that stores data, an input/output unit and a loopback circuit. The input/output unit inputs and outputs data of a predetermined number of bits in synchronization with a clock signal. The input/output unit may include, but is not limited to, the same number of data input/output terminals as the predetermined number of bits. The loopback circuit performs loopback operation to read data of the predetermined number of bits out of a first optional area of the memory and to write the data into a second optional area of the memory.

18 Claims, 15 Drawing Sheets

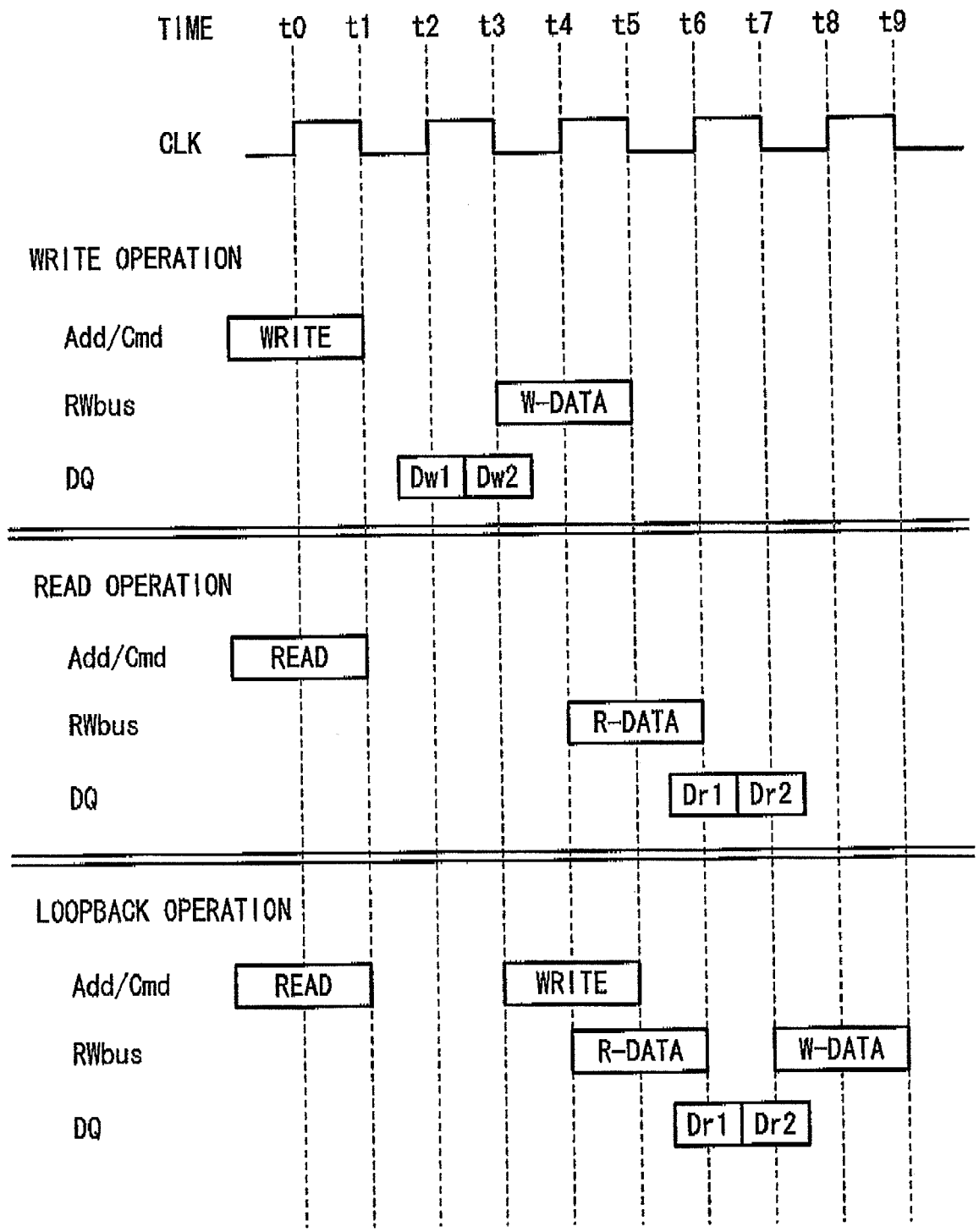

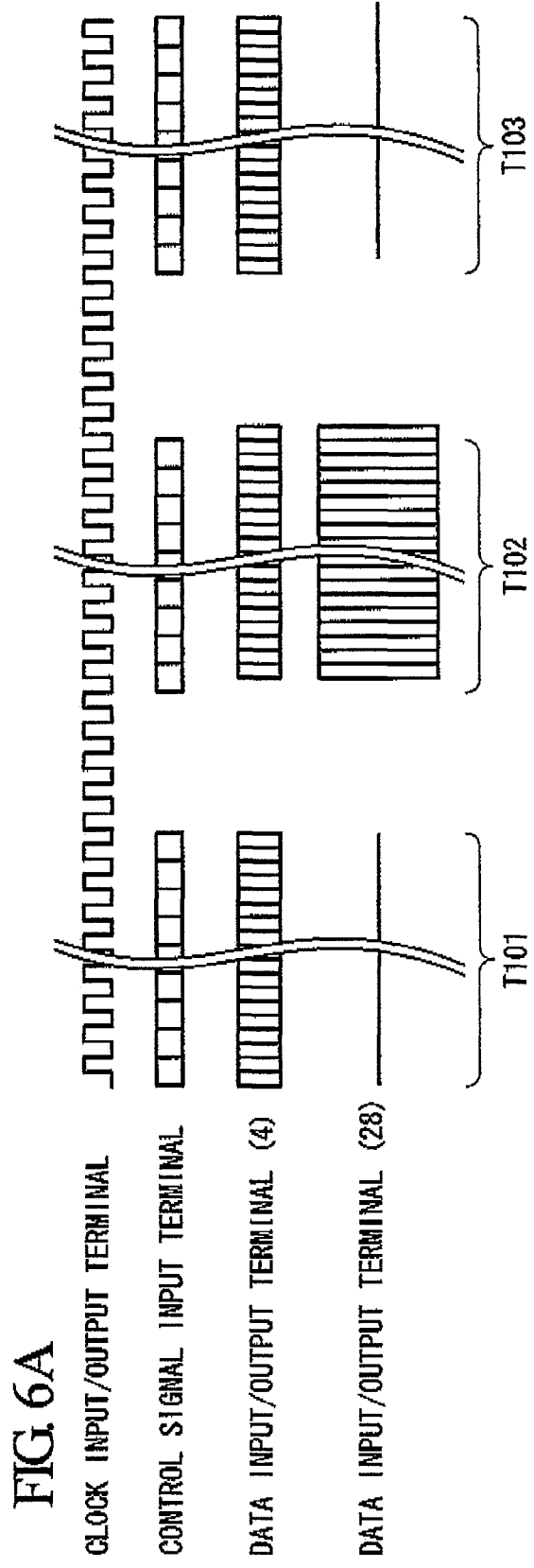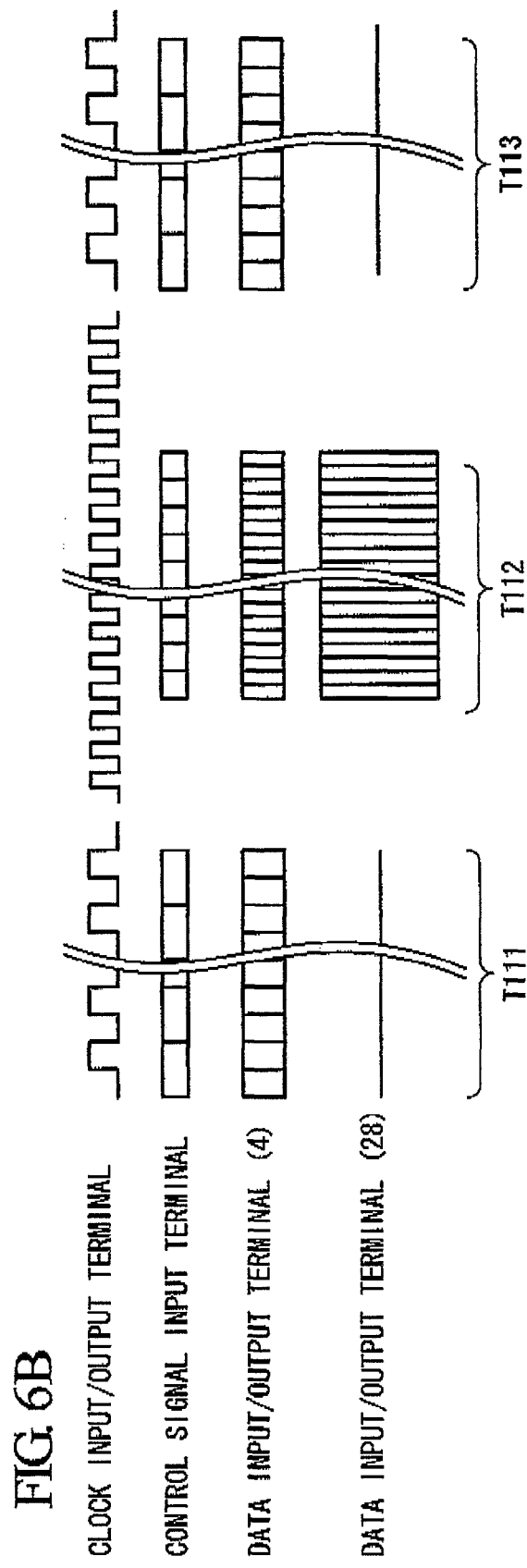
FIG. 6A
FIG. 6B

SEMICONDUCTOR MEMORY DEVICE AND METHOD OF TESTING SEMICONDUCTOR MEMORY DEVICE

BACKGROUND OF THE INVENTION

1. Field of the Invention

The present invention generally relates to a semiconductor memory device and a method of testing a semiconductor memory device. More specifically, the present invention relates to a semiconductor memory device with a reduced number of input/output terminals to be used for operation test and a method of testing the semiconductor memory device.

Priority is claimed on Japanese Patent Application No. 2008-0143580, filed May 30, 2008, the content of which is incorporated herein by reference.

2. Description of the Related Art

In general, test for semiconductor memory devices such as DDR-SDRAM has been performed as follows. Data as supplied from the outside are written or stored into a predetermined memory area of the semiconductor memory device. The stored data are then read out of the memory area and then supplied to the outside.

FIG. 14 is a schematic diagram illustrating a semiconductor memory device 91 and a tester 90 which is connected to the semiconductor memory device 91 in accordance with the related art.

The semiconductor memory device 91 includes a control circuit 911, a memory 912 including a memory cell array, a serial-parallel converter circuit 913, a clock input terminal 915, a control signal input terminal 916, and a plurality of data input/output terminals 917. The plurality of data input/output terminals 917 may be, typically, but not limited to, thirty two data input/output pins.

The tester 90 generates a clock signal, an address signal and a control signal and supplies these signals to the semiconductor memory device 91. Typical examples of the control signal may include any command signals for read and write operations. The tester 90 performs data input and output to the semiconductor memory device 91 through the data input/output terminals 917.

The semiconductor memory device 91 will be described in detail. The control circuit 911 receives an input of the clock signal from the clock input terminal 915 and an input of the control signal from the control signal input terminal 916. The control circuit 911 controls read and write operations to the memory 912 based on the clock signal and the control signal. The memory 912 includes a memory cell array. The serial-parallel converter circuit 913 converts data of 64-bits into a series of data of 32-bits. The data of 64-bits are input into the serial-parallel converter circuit 913 from the memory 912 at the rising edge of the clock signal. The data of 64-bits are also output from the serial-parallel converter circuit 913 at the rising edge of the clock signal and then supplied to the memory 912. The series of data of 32-bits is input into and output from the serial-parallel converter circuit 913 at the rising and falling edges of the clock signal.

FIG. 15 is a schematic diagram illustrating test operation for the semiconductor memory device 91 using the tester 90 in accordance with the related art. In a first time period T901, the tester 90 supplies the control signal including write command and the clock signal to the semiconductor memory device 91, so as to write data of 32-bits into the semiconductor memory device 91. In a second time period T902, the tester 90 supplies the other control signal including read command and the clock signal to the semiconductor memory device 91, so as to receive the input of data of 32-bits from the semiconductor memory device 91. The tester 90 determines whether the input data of 32-bits are identical to a predetermined set of data, so that the tester 90 detects any failure of the semiconductor memory device 91.

In case that the test for the semiconductor memory device is performed in the same way as described above, the increase in the number of the data input/out terminals of the semiconductor memory device needs the increase in the input/out terminals of the tester which are connected to the data input/out terminals of the semiconductor memory device, thereby decreasing the number of the semiconductor memory devices that are together connected to the single tester. Decreasing the number of the semiconductor memory devices that are together connected to the single tester may increase the time to be lapsed for completing the test operation as well as increase the cost for performing the test operation. For example, sixty four semiconductor memory devices with the data input/output terminals for data of 4-bits can be connected together to the tester that has 256 input/output terminals. Bight semiconductor memory devices with the data input/output terminals for data of 32-bits can be connected together to the tester that has 256 input/output terminals.

In other cases, an advanced tester with high resolution to measure a signal with high speed transition may be useful to perform the test operations for semiconductor devices having high speed performances. The semiconductor devices with high speed performances may perform input and output operations at high speed or at high frequencies of 533 MHz and 666 MHz. A typical example of each the semiconductor device may be, but is not limited to, a controller for DDR-SDRAM.

Japanese Unexamined Patent Application, First Publication, No. 2007-317016 discloses a technique for performing the test operation for the semiconductor devices without using the advanced tester, wherein a loop-back circuit is used for feeding back the output from the semiconductor device to the same. FIG. 16 is a schematic diagram illustrating a semiconductor circuit 92 and a tester 90 which is connected to the semiconductor circuit 92 in accordance with the related art. A serial-parallel converter circuit 923 receives an input of data from a control circuit 921. The serial-parallel converter circuit 923 supplies the data to a comparator 924. The comparator 924 receives an input of data from the serial-parallel converter circuit 923. The comparator 924 also receives an input of data from the control circuit 921. The comparator 924 compares two sets of data from the serial-parallel converter circuit 92 and from the control circuit 921. The comparator 924 compares the set of data that is output from the control circuit 921 to the set of data that is output from the serial-parallel converter circuit 923, thereby performing the test operations for the semiconductor circuit 92, without performing operations of high speed input/output of data between the semiconductor circuit 92 and the tester 90.

FIG. 17 is a schematic diagram illustrating a semiconductor circuit 93 and a tester 90 which is connected to the semiconductor circuit 93 in accordance with the related art. The semiconductor circuit 93 includes a control circuit 931, a memory 932 including a memory cell array, a serial-parallel converter circuit 933, a comparator 934, a clock input terminal 935, a control signal input terminal 936, and a plurality of data input/output terminals 937. The semiconductor circuit 93 uses the loop-back circuit for feeding back the output from the semiconductor device to the same. The tester 90 generates a clock signal, an address signal and a control signal and supplies these signals to the semiconductor memory device 93. Typical examples of the control signal may include any command signals for read and write operations. The tester 90 does not perform data input and output to the semiconductor memory device 93.

In the semiconductor circuit 93, the control circuit 931 receives the clock signal from the clock input terminal 935. The control circuit 931 also receives the control signal from the control signal input terminal 936. The control circuit 931 controls the operations of reading and writing data to the memory 932 as well as switches the serial-parallel converter circuit 933, based on the clock signal and the control signal. In the test operations, the control circuit 931 controls the comparator 934 so that the comparator 934 compares the output from the memory 932 with the output from the serial-parallel converter circuit 933, and generates a result of that comparison.

In reading operation, the serial-parallel converter circuit 933 converts data of 64-bits into a series of data of 32-bits and then supplies the series of data of 32-bits to the plurality of data input/output terminals 937. The data of 64-bits are input into the serial-parallel converter circuit 933 from the memory 932 at the rising edge of the clock signal. The data of 64-bits are also output from the serial-parallel converter circuit 933 at the rising edge of the clock signal and then supplied to the memory 932. The series of data of 32-bits are input into and output from the serial-parallel converter circuit 933 at the rising and falling edges of the clock signal.

In writing operation, the serial-parallel converter circuit 933 converts a series of data of 32-bits into data of 64-bits and then supplies the data of 64-bits to the memory 932 and the comparator 934. The series of data of 32-bits are input into the serial-parallel converter circuit 933 from the plurality of data input/output terminals 937 at the rising and falling edges of the clock signal. The data of 64-bits are output from the serial-parallel converter circuit 933 at the rising edge of the clock signal.

In test-result termination, the serial-parallel converter circuit 933 supplies data signals of 64-bits to the comparator 934, wherein the data signals of 64-bits have been input to the serial-parallel converter circuit 933 from the memory 932.

The comparator 934 compares the data signal of 64-bits from the memory 932 to the data signal of 64-bits from the serial-parallel converter circuit 933, so that the comparator 934 generates a result of that comparison.

The tester 90 supplies the clock signal and the control signal including read command to the semiconductor memory device 93. In the semiconductor memory device 93, the control circuit 931 supplies data stored in the memory 932 to the serial-parallel converter circuit 933, based on the clock signal and the control signal including read command. The control circuit 931 controls the serial-parallel converter circuit 933 to supply the data signals to the comparator 934.

The comparator 934 compares the data signals of 64-bits from the memory 932 to the data signals of 64-bits from the serial-parallel converter circuit 933, so that the comparator 934 generates a result of that comparison. The control circuit 931 supplies the result of the comparison from the comparator 934 to the tester 90.

As described above, the serial-parallel converter circuit 933 through which input and output data of the memory 932 axe transferred is subjected to an operation test such as a real operation speed test without performing any high speed input/output operation for data, for example, at 533 MHz or 666 MHz between the semiconductor memory device 93 and the tester 90.

SUMMARY

In one embodiment, a semiconductor memory device may include, but is not limited to, a memory that stores data, an input/output unit and a loopback circuit. The input/output unit inputs and outputs data of a predetermined number of bits in synchronization with a clock signal. The input/output unit may include, but is not limited to, the same number of data input/output terminals as the predetermined number of bits. The loopback circuit performs loopback operation to read data of the predetermined number of bits out of a first optional area of the memory and to write the data into a second optional area of the memory.

In another embodiment, a method of performing a test for a semiconductor memory device may include, but is not limited to, the following processes. A loopback operation can be performed to read test data of a predetermined number of bits out of a first optional area of a memory and to write the test data into a second optional area of the memory. The test data is read out of the second optional area of the memory. A determination is made on whether the test data are identical to a predetermined set of expected values to detect failure of the semiconductor memory device.

BRIEF DESCRIPTION OF THE DRAWINGS

The above features and advantages of the present invention will be more apparent from the following description of certain preferred embodiments taken in conjunction with the accompanying drawings, in which:

FIG. 3 is a timing chart illustrating write operation, read operation and loopback operation of the loopback block of FIG. 2;

FIG. 6A is a diagram illustrating an example of the test operations for the semiconductor memory device of FIG. 1 by using the tester;

FIG. 6B is a diagram illustrating another example of the test operations for the semiconductor memory device of FIG. 1 by using the tester;

DETAILED DESCRIPTION OF THE PREFERRED EMBODIMENTS

Before describing the present invention, the related art will be explained again, in order to facilitate the understanding of the present invention.

In some cases, the serial-parallel converter circuit through which input and output data of the memory are transferred is subjected to an operation test without performing any high speed input/output operation for data between the semiconductor memory device and the tester. A set of data as read out of the memory is compared to the other set of data. No test for the memory or write-operation test is performed. Some advanced semiconductor memory devices process data of 32-bits or 64-bits at high speed or high frequency. Sometimes, plural signals on data lines may simultaneously be transitioned, thereby causing cross-talk noise that causes failure of input and output operations of write-data and read-data. It is necessary to perform the test including write-operation to write data into the memory.

As described above, the increase in the number of the data input/out terminals of the semiconductor memory device needs the increase in the input/out terminals of the tester which are connected to the data input/out terminals of the semiconductor memory device, thereby decreasing the number of the semiconductor memory devices that are together connected to the single tester. Decreasing the number of the semiconductor memory devices that are together connected to the single tester may increase the time to be lapsed for completing the test operation as well as increase the cost for performing the test operation.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

First Embodiment

Figure 1:
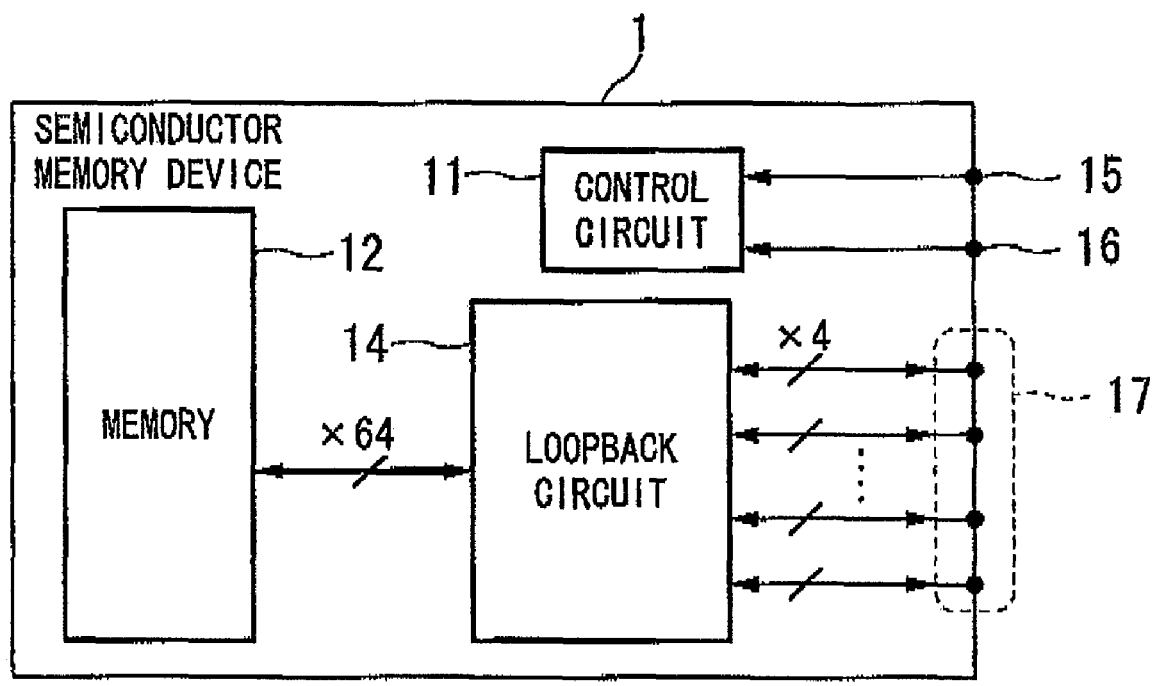
FIG. 1 is a block diagram illustrating a semiconductor memory device in accordance with a first preferred embodiment of the present invention.

FIG. 1 is a block diagram illustrating a semiconductor memory device 1 in accordance with a first preferred embodiment of the present invention. A semiconductor memory device 1 may include, but is not limited to, a control circuit 11, a memory 12, a loopback circuit 14, a clock signal input terminal 15 to which a clock signal is input, a control signal terminal 16 to which a control signal is input, and data input/output terminals 17 for 32-bits data.

In the semiconductor memory device 1, the control circuit 11 controls read/write operations of reading or writing data into the memory 11, so that the read/write operations are synchronized with the clock signal that has been input through the clock signal input terminal 15, and that the read/write operations are performed in accordance with the control signal that include an address signal, wherein the control signal has been input through the control signal terminal 16. In some cases, the control signal may include, but is not limited to, a chip select signal, a row address strobe signal, a column address strobe signal, and a write enable signal. The control circuit 11 controls the loopback circuit 14.

Data supplied from the loopback circuit 14 are stored into a designated area of the memory 12, wherein the designated area has been designated by the control circuit 11. The stored data are read out of the designated area of the memory 12 the memory 12 and the read data are then input into the loopback circuit 14, The loopback circuit 14 receives an input of data of 32-bits from the data input/output terminals 17, wherein the input of the data of 32-bits is synchronized with the rising edge of the clock signal. The loopback circuit 14 receives an input of data of other 32-bits from the data input/output terminals 17, wherein the input of the other data of 32-bits is synchronized with the falling edge of the clock signal. The loopback circuit 14 generates a set of data of 64-bits from the data of 32-bits and the other 32-bits. The loopback circuit 14 outputs the set of data of 64-bits that is supplied to the memory 12, wherein the output of the data of 64-bits is synchronized with the falling edge of the clock signal.

The loopback circuit 14 receives an input of data of 64-bits from the memory 12, wherein the input of data of 64-bits is synchronized with the falling edge of the clock signal. The loopback circuit 14 divides the data of 64-bits into first and second sets of data of 32-bits. The loopback circuit 14 supplies the first set of data of 32-bits to the data input/output terminals 17 in synchronization with the rising edge of the clock signal. The loopback circuit 14 also supplies the first set of data of 32-bits to the data input/output terminals 17 in synchronization with the falling edge of the clock signal.

The loopback circuit 14 performs loopback operation, wherein the loopback circuit 14 receives the input data of 64-bits from the memory 12 and then supplies the data of 64-bits to the memory 12. The loopback circuit 14 performs loopback operation under the control by the control circuit 11. In read operation in test mode to detect failure of the semiconductor memory device 1, the loopback circuit 14 selects sequentially a set of data of 4-bits in the data of 64-bits that has been input from the memory 12, and then output the selected set of data of 4-bits through a previously selected set of four terminals of the data input/output terminals 17.

The loopback circuit 14 has a buffer register for 64-bits for operations of writing and reading test data in the operation test.

Figure 2:
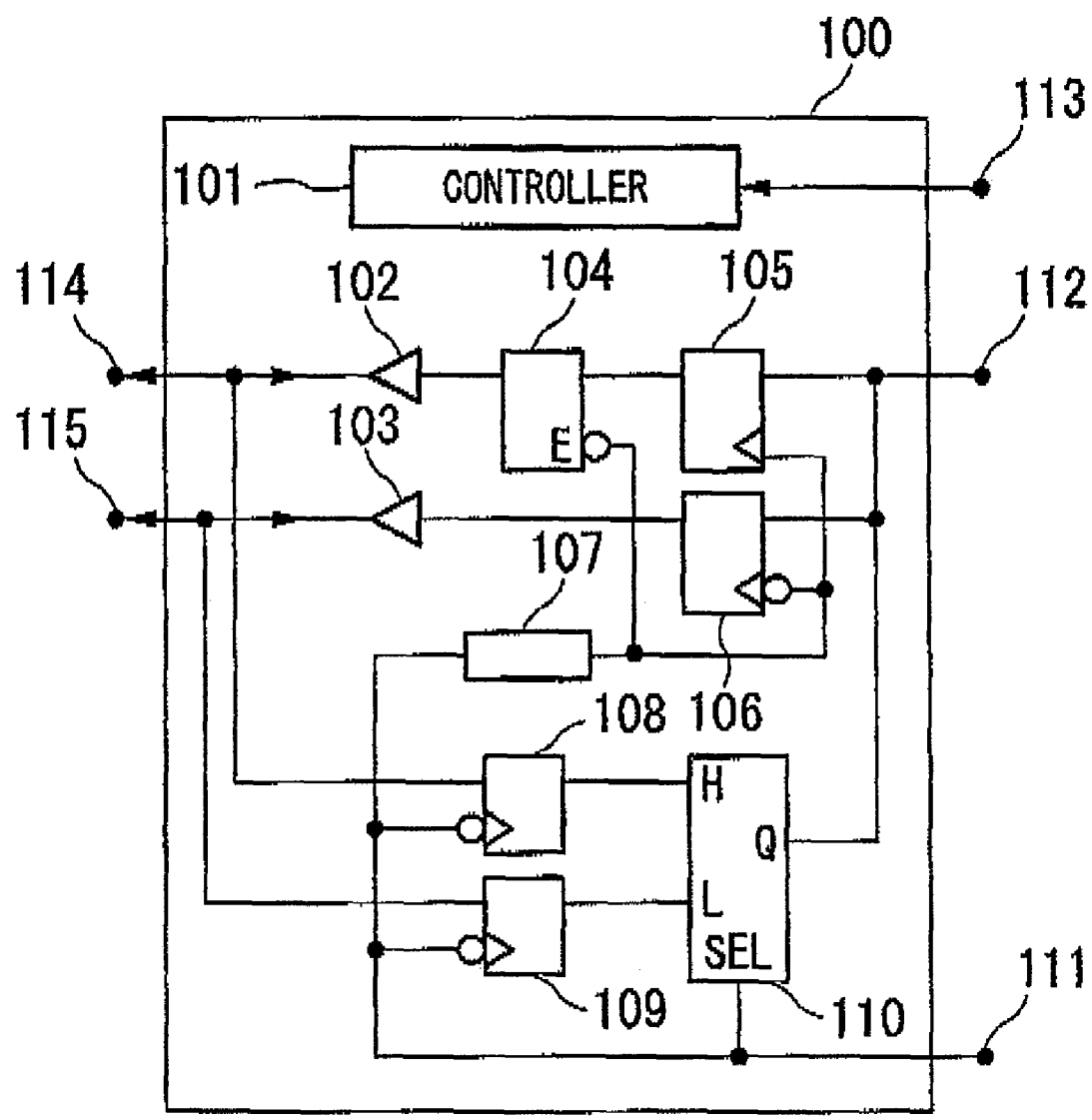
FIG. 2 is a block diagram illustrating the configuration of a loopback block that is included in the loopback circuit shown in FIG. 1.

FIG. 2 is a block diagram illustrating the configuration of a loopback block 100 that is included in the loopback circuit 14 shown in FIG. 1.

The loopback block 100 may include, but is not limited to, a controller 101, buffers 102 and 103, flip-flop circuits 105, 106, 108, and 109, a programmable delay element 107, a selector 110, a clock signal input terminal 111, a data input/output terminal 112, a control signal terminal 113, and internal data input/output terminals 114 and 115.

In the loopback block 100, each of the internal data input/output terminals 114 and 115 is a terminal for input and output of data of 32-bits. The internal data input/output terminals 114 and 115 are connected to the memory 12. Input and output of the data of 64-bits into and from the memory 12 are performed through the internal data input/output terminals 114 and 115.

The control signal terminal 113 receives an input of the control signal. The control signal may include, but is not limited to, signals indicating read operation and write operation and a signal that selects a delay time of the programmable delay element 107. The data input/output terminal 112 is a terminal for input and output of data of 32-bits. The data input/output terminal 112 is connected to the data input/output terminals 17. The clock signal input terminal 111 is connected to the clock signal input terminal 15.

The clock signal input terminal 111 receives an input of the clock signal. The clock signal is then supplied to the selector 110, the flip-flop circuits 108 and 109, and the programmable delay element 107.

The selector 110 selects output data from the flip-flop circuit 108 when the level of the clock signal from the clock signal input terminal 111 is "H" or high level. The selector 110 selects output data from the flip-flop circuit 109 when the level of the clock signal from the clock signal input terminal 111 is "L" or low level. The controller 101 places the output of the selector 110 in high impedance state when data is input from the data input/output terminal 112.

The flip-flop circuit 109 stores or holds the data of 32-bits from the internal data input/output terminal 115 in synchronization with the falling edge of the clock signal. The flip-flop circuit 108 stores or holds the data of 32-bits from the internal data input/output terminal 114 in synchronization with the falling edge of the clock signal.

The programmable delay element 107 receives the clock signal and delays the clock signal, thereby generating a delay clock signal. The programmable delay element 107 delays the clock signal so as to avoid racing between data and clock signal when the data stored in the flip-flop circuits 108 and 109 is input through the selector 110 into the flip-flop circuits 105 and 106, so that the input data is then stored or held in the flip-flop circuits 105 and 106. In some cases, the delay time of the programmable delay element 107 can be decided based on, but not limited to, a result of measurement that can be obtained after layout of circuitries and interconnections of the semiconductor memory device 1.

The flip-flop circuit 106 stores or holds the data of 32-bits from either the data input/output terminal 112 or the selector 110 in synchronization with the falling edge of the delay clock signal. The flip-flop circuit 105 stores or holds the data of 32-bits from either the data input/output terminal 112 or the selector 110 in synchronization with the rising edge of the delay clock signal.

The latch 104 transfers the data of 32-bits having been supplied from the flip-flop circuit 105 to the buffer 102, upon receipt of an input of low level "L" of the clock signal. The latch 104 latches the input data of 32-bits when the level of the clock signal is transitioned from low level "L" to high level "H".

In write operation for storing data in the memory 12, the buffer 102 supplies the data that has been supplied from the latch 104 to the internal data input/output terminal 114. The controller 101 places the output of the buffer 102 in high impedance state when data is read out of the memory 12.

In write operation for storing data in the memory 12, the buffer 103 supplies the data that has been supplied from the flip-flop circuit 106 to the internal data input/output terminal 115. The controller 101 places the output of the buffer 103 in high impedance state when data is read out of the memory 12. The operations of the buffer 103 are switched under the control by the controller 113.

The controller 101 controls the outputs from the selector 110 and the buffers 102 and 103, based on the signal that indicates read operation and write operation, wherein that signal has been supplied through the control signal terminal 113 from the control circuit 11.

Operations of the loopback block 100 will be described. FIG. 3 is a timing chart illustrating write operation, read operation and loopback operation of the loopback block 100 of FIG. 2. The descriptions will be made, assumed that the semiconductor memory device 1 is DDR1 SDRAM, Burst Length (BL) is 2, and Column Address Strobe Latency (CL) is 2.5.

[Write Operation]

At a time t0, the control circuit 11 receives an input of write command "Write", which includes an address signal that designates an area for writing data, from the control signal input terminal 16 (Add/Cmd), so that the control circuit 11 decodes the write command "write" and supplies the decoded signal to the control signal terminal 113. The controller 101 decodes the signal that has been input from the control signal terminal 113, so that the controller 101 places the output of the selector 110 in high impedance state.

At a time t2, the flip-flop circuit 105 stores data Dw1 that has been input from the data input/output terminal 112 in synchronization with the rising edge of the delay clock signal.

At a time t2, the latch 104 supplies the output signal from the flip-flop circuit 105 to the buffer 102 upon receipt of the low level "L" of the delay clock signal. The buffer 102 supplies the input signal to the internal data input/output terminal 114 (RWbus).

The flip-flop circuit 106 stores data Dw2 that has been input from the data input/output terminal 112 in synchronization with the falling edge of the delay clock signal. The flip-flop circuit 106 supplies the stored data to the buffer 103. The buffer 103 supplies the input data to the internal data input/output terminal 115 (RWbus).

At a time t4, the latch 104 latches the data Dw1 supplied from the flip-flop circuit 105 and then the latch 104 outputs the data Dw1.

As described above, upon receipt of an input of the write command, the loopback block 100 once stores the data Dw1 and Dw2 which have been supplied from the data input/output terminal 112 in synchronization with the rising edge and falling edge of the clock signal, respectively, so that the loopback block 100 combines the data Dw1 and Dw2 to generate a set of data W-Data which is supplied to the internal data input/output terminals 114 and 115.

[Read Operation]

At a time t0, the control circuit 11 receives an input of write command "Read", which includes an address signal that designates an area for reading data, from the control signal input terminal 16 (Add/Cmd), so that the control circuit 11 decodes the read command "Read" and supplies the decoded signal to the control signal terminal 113. The controller 101 decodes the signal that has been input from the control signal terminal 113, so that the controller 101 places the outputs of the buffers 102 and 103 in high impedance state.

At a time t4, the loopback circuit 14 receives an input of the data R-Data that has been read out of the memory 12 from the internal data input/output terminals 114 and 115.

At a time t5, the flip-flop circuit 108 stores data Dr2 of the set of data R-Data and outputs the data Dr2 in synchronization with the falling edge of the clock signal. Also, the flip-flop circuit 109 stores data Dr1 of the set of data R-Data and outputs the data Dr1 in synchronization with the falling edge of the clock signal. At this time, the selector 110 selects the data Dr1 output from the flip-flop circuit 109 based on the low level "L" of the clock signal, and supplies the data Dr1 to the data input/output terminal 112.

At a time t6, upon receipt of an input of the high level "H" of the clock signal, the selector 110 selects data Dr2 that has been output from the flip-flop circuit 108, and then supplies the data Dr2 to the data input/output terminal 112.

As described above, upon receipt of an input of the read command, the loopback block 100 receives an input of data R-Data that has been read out of the memory 12 in synchronization with the falling edge and falling edge of the clock signal. The loopback block 100 outputs the first set of data Dr1 of 32-bits of the input data R-Data in synchronization with the rising edge and failing edge of the clock signal. The loopback block 100 outputs the second set of data Dr2 of 32-bits of the input data R-Data in synchronization with the falling edge and falling edge of the clock signal.

[Loopback Operation]

At a time t0, the control circuit 11 receives an input of write command "Read", which includes an address signal that designates an area for reading data, from the control signal input terminal 16 (Add/Cmd), so that the control circuit 11 decodes the read command "Read" and supplies the decoded signal to the control signal terminal 113. The controller 101 decodes the signal that has been input from the control signal terminal 113, so that the controller 101 places the outputs of the buffers 102 and 103 in high impedance state.

At a time t3, the control circuit 11 receives an input of write command "Writ", which includes an address signal that designates an area for writing data, from the control signal input terminal 16 (Add/Cmd), so that the control circuit 11 decodes the write command "Write" and supplies the decoded signal to the control signal terminal 113.

At a time t4, the loopback circuit 14 receives an input of the data R-Data that has been read out of the memory 12 from the internal data input/output terminals 114 and 115.

At a time t5, the flip-flop circuit 108 stores data Dr1 of the set of data R-Data and outputs the data Dr2 in synchronization with the falling edge of the clock signal. Also, the flip-flop circuit 109 stores data Dr1 of the set of data R-Data and outputs the data Dr1 in synchronization with the falling edge of the clock signal. At this time, the selector 110 selects the data Dr1 output from the flip-flop circuit 109 based on the low level "L" of the clock signal, and supplies the data Dr1 to the data input/output terminal 112.

The flip-flop circuit 106 stores the data Dr1 that has been output from the selector 110 in synchronization: with the falling edge of the delay clock signal.

At a time t6, the flip-flop circuit 106 stores the data Dr1 that has been output from the selector 110 in synchronization with the rising edge of the delay clock signal.

At a time t7, the controller 101 controls the buffers 102 and 103 to output the data. Upon receipt of an input of the low level "L" of the clock signal, the selector 110 selects the data Dr2 that has been output from the flip-flop circuit 108, and then supplies the data Dr2 to the data input/output terminal 112 and the flip-flop circuits 105 and 106. The flip-flop circuit 106 stores the data Dr2 that has been output from the selector 110 and supplies the data Dr2 to the buffer 103 in synchronization with the falling edge of the delay clock signal. The buffer 103 supplies the data Dr2 to the internal data input/output terminal 115.

Upon receipt of an input of the low level "L" of the clock signal, the latch 104 supplies the data Dr1 that has been output from the flip-flop circuit 105 to the buffer 102. The buffer 102 the data Dr1 to the internal data input/output terminal 114.

At a time t8, the latch 104 latches the data Dr1 having been output from the flip-flop circuit 105 in synchronization with the rising edge of the delay clock signal.

The read command "Read" and the write command "Write" are input at a clock cycle so that the read data based on the read command "Read" and the write data based on the write command "Write" overlap. The loopback block 100 performs the loopback operation, so that the loopback block 100 supplies the data R-Data as the data corresponding to the write command "Write" to the internal data input/output terminals 114 and 115, wherein the data R-Data as corresponding to the read command "Read" has having already been input from the internal data input/output terminals 114 and 115. The semiconductor memory device 1 can read data out of an area of the memory 12 and then write the data into a different area of the memory 12 from the area in which the data had been stored, without outputting the data to the outside.

The clock cycle of making the read data and the write data overlap can be determined based on the Column Address Strobe Latency (CL) and the timing of inputting data of the write command (latency).

Figure 4A:
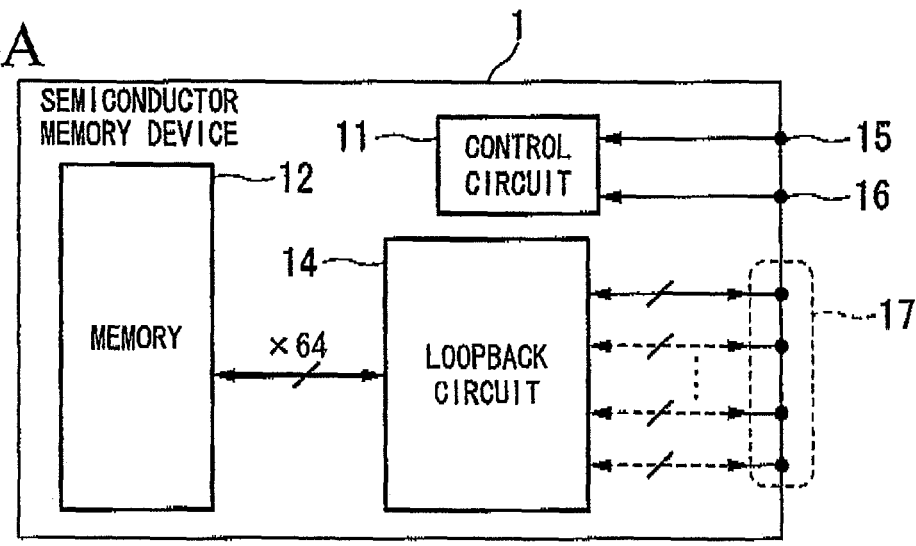
FIG. 4A is a block diagram illustrating test operations of the semiconductor memory device of FIG. 1.

FIG. 4A is a block diagram illustrating test operations of the semiconductor memory device 1 of FIG. 1. In FIG. 4A, the semiconductor memory device 1 is subjected to an operation test in which data input and output are made through a selected set of four terminals in the data input/output terminals 17. The selected set of four terminals is thus used commonly for operation test. In FIG. 4A, the broken-line arrow marks between the loopback circuit 14 and the data input/output terminals 17 represent no input/output of any valid data. The real-line arrow mark between the loopback circuit 14 and the data input/output terminals 17 represents effective input and output of data of 4-bits through the selected set of four terminals 17.

In read operation, the control circuit 11 controls the loopback circuit 14 to read data of 64-bits out of the memory 12 and temporary stores the buffer register the data of 64-bits, so that the data of 64-bits are sequentially output 4-bits by 4-bits from the selected set of four terminals 17. In write operation, the control circuit 11 controls the loopback circuit 14 to sequentially store every set of data of 4-bits in the buffer registers until the buffer register holds the sets of data of 4-bits that correspond to the data of 64-bits. After the buffer register holds the sets of data of 4-bits that correspond to the data of 64-bits, the control circuit 11 controls the memory 12 to store the data of 64-bits therein.

Figure 4B:
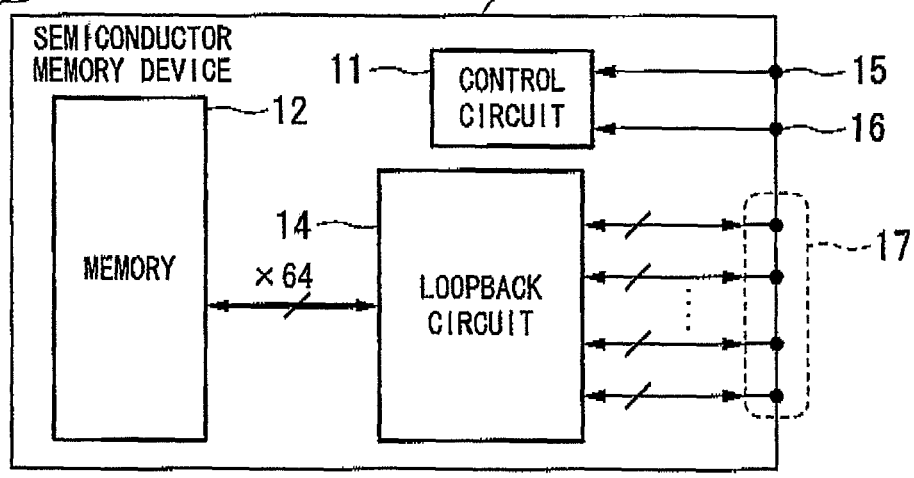
FIG. 4B is a block diagram illustrating normal operations of the semiconductor memory device of FIG. 1.

FIG. 4B is a block diagram illustrating normal operations of the semiconductor memory device 1 of FIG. 1. In FIG. 4B, the semiconductor memory device 1 is subjected to the normal operation, in which data input and output are made through all of the data input/output terminals 17. The real-line arrow marks between the loopback circuit 14 and the data input/output terminals 17 represent that data input and output are made through all of the data input/output terminals 17.

Figure 4C:
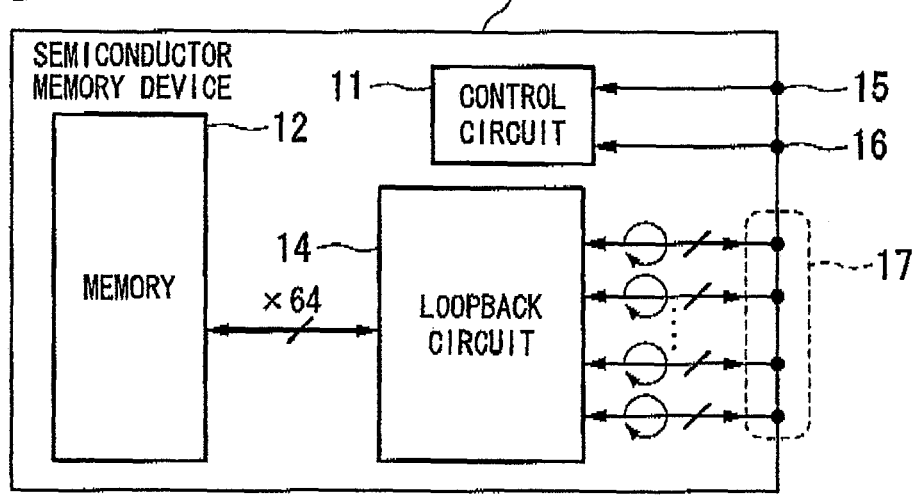
FIG. 4C is a block diagram illustrating loopback operations of the semiconductor memory device of FIG. 1.

FIG. 4C is a block diagram illustrating loopback operations of the semiconductor memory device 1 of FIG. 1. In FIG. 4C, the semiconductor memory device 1 is subjected to the loopback operation for operation test, in which read and write operations of reading and writing data of 64-bits into the memory 12 without making input and output of data through the data input/output terminals 17. The loopback circuit 14 performs loopback operation.

Figure 5A:
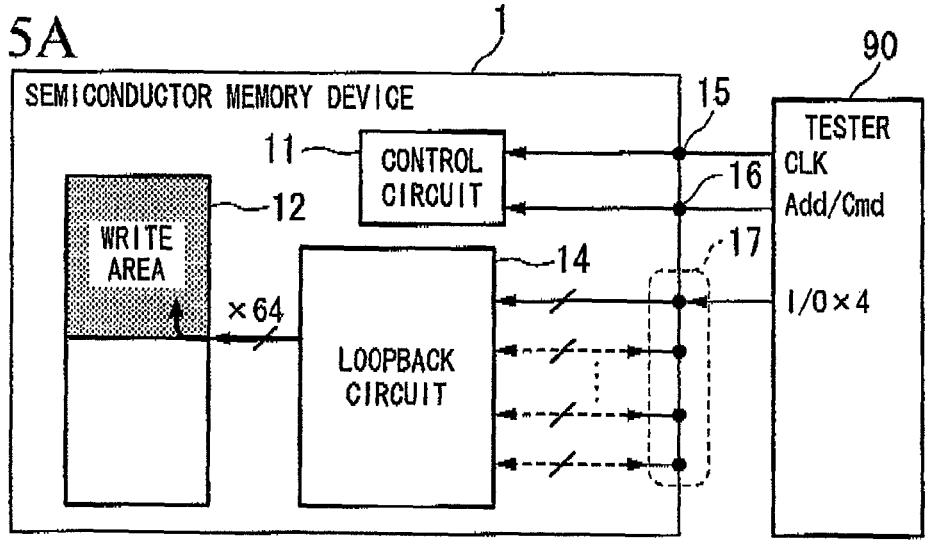
FIG. 5A is a block diagram illustrating write operation of writing test data from a tester to the semiconductor memory device in accordance with the test method for the semiconductor memory device of FIG. 1.

Operations in the test mode of the semiconductor memory device 1 will be described. FIG. 5A is a block diagram illustrating write operation of writing test data from a tester 90 to the semiconductor memory device 1 in accordance with the test method for the semiconductor memory device 1 of FIG. 1. The semiconductor memory device 1 is connected to the tester 90. The semiconductor memory device 1 receives an input of the clock signal through the clock signal input terminal 15 from the tester 90. The semiconductor memory device 1 also receives an input of the control signal through the control signal terminal 16 from the tester 90. The semiconductor memory device 1 also receives an input of test data through the selected set of four data input/output terminals 17 from the tester 90. The four selected data input/output terminals 17 are connected to four I/O terminals of the tester 90.

The tester 90 sequentially supplies the semiconductor memory device 1 with test data 4-bits by 4-bits to be written into a write area "Write Area" that is designated by the address signal included in the control signal. The test data as inputted are supplied through the buffer register of the loopback circuit 14 to the memory 12, so that the test data is stored in the memory 12.

Figure 5B:
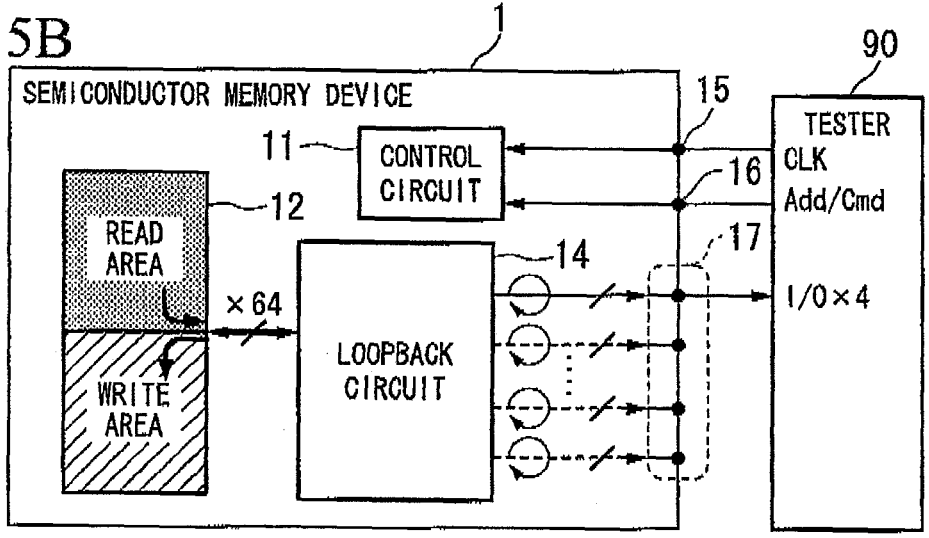
FIG. 5B is a block diagram illustrating loopback operation of the loopback circuit in the semiconductor memory device in accordance with the test method for the semiconductor memory device of FIG. 1.

FIG. 5B is a block diagram illustrating loopback operation of the loopback circuit 14 in the semiconductor memory device 1 in accordance with the test method for the semiconductor memory device 1 of FIG. 1. After the write operation of writing the test data has been completed, the tester 90 supplies the read command "Read" and the write command "Write" alternately through the control signal input terminal 16 into the semiconductor memory device 1. The control circuit 11 controls the loopback circuit 14 to perform loopback operation so as to read the test data out of the memory 12 and then to write data 64-bits by 64-bits in different areas of the memory 12.

Figure 5C:
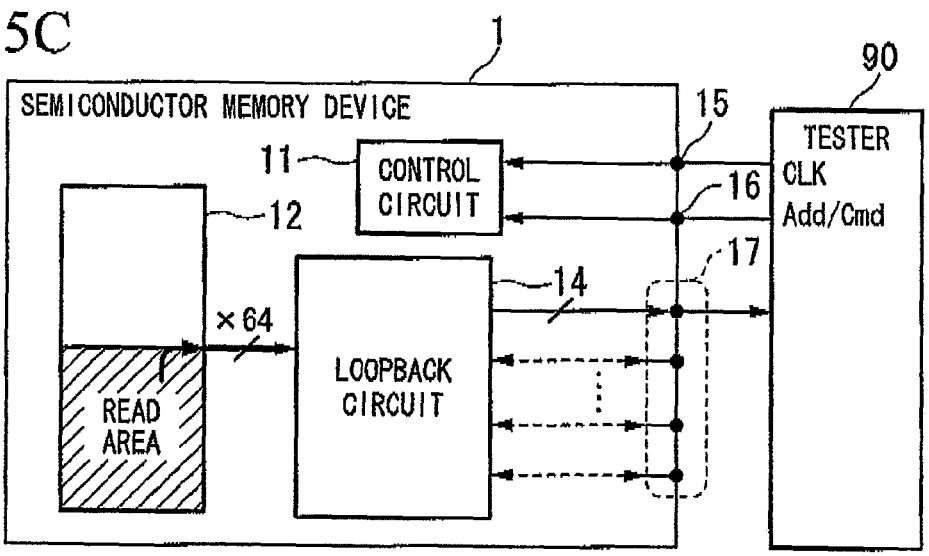
FIG. 5C is a block diagram illustrating read operation of reading the test data from the memory in the semiconductor memory device in accordance with the test method for the semiconductor memory device 1 of FIG. 1.

FIG. 5C is a block diagram illustrating read operation of reading the test data from the memory 12 in the semiconductor memory device 1 in accordance with the test method for the semiconductor memory device 1 of FIG. 1. The tester 90 supplies the read command "Read" for test to the semiconductor memory device 1 through the control signal input terminal 16, so that the data that had been written by the loopback operation is read out of the memory 12, and the data is supplied to the tester 90. The tester 90 determines whether the data as read out correspond to a predetermined set of expected values, thereby detecting any failure of the semiconductor memory device 1. The test data is read out of the memory 12 and supplied from the semiconductor memory device 1 to the tester 90 through the buffer register of the loopback circuit 14 4-bits by 4-bits.

FIG. 6A is a diagram illustrating an example of the test operations for the semiconductor memory device 1 by using the tester 90. In an input time period T101, the tester 90 supplies the control signal including the write command and the clock signal to the semiconductor memory device 1. The tester 90 also supplies test data of 4-bits to the semiconductor memory device 1 so that the semiconductor memory device 1 stores the test data therein.

In a time period T102, the tester 90 supplies the clock signal and the control signal to the semiconductor memory device 1, wherein the control signal includes the read command and the write command for loopback operation. In the time period T102, the semiconductor memory device 1 reads the test data out of the memory 12 and then stores the test data as read into a new memory area designated by the address signal that is included in the write command.

In a time period T103, the tester 90 supplies the supplies the clock signal and the control signal to the semiconductor memory device 1, wherein the control signal includes the read command. The semiconductor memory device 1 reads the test data out of the memory 12 4-bits by 4-bits, wherein the test data had been written by the loopback operation. The data is then supplied to the tester 90. The tester 90 determines whether the data as read out correspond to a predetermined set of expected values, thereby detecting any failure of the semiconductor memory device 1. The test data is read out of the memory 12 and supplied from the semiconductor memory device 1 to the tester 90 through the buffer register of the loopback circuit 14 4-bits by 4-bits.

The above-described test operations of writing and reading test data into the semiconductor memory device 1 allows conducting the test by using a reduced number of terminals of the tester that are connected to the semiconductor memory device 1.

FIG. 6B is a diagram illustrating another example of the test operations for the semiconductor memory device 1 by using the tester 90. It is possible that the test operation can be performed using clock signals that are lower in frequency than the clock signal that is used for performing the real operations, thereby allowing the test operation without using any advanced tester that has input/output terminals for high speed and highly accurate operations. For example, different clock signals are used in writing and reading the test data from the clock signal that is used for the real operation. The different clock signals for writing and reading the test data are lower in frequency than the clock signal that is used for the real operation. In the time periods T111 and T113, the tester 90 supplies the semiconductor memory device 1 with the clock signal that is lower in frequency than the clock signal that is supplied in the time period T112.

In the time period T111, the tester 90 supplies the control signal including the write command and the lower-frequency clock signal to the semiconductor memory device 1. The tester 90 also supplies test data of 4-bits to the semiconductor memory device 1 so that the semiconductor memory device 1 writes the test data therein.

In the time period T112, the tester 90 supplies the clock signal that is higher in frequency than the lower-frequency clock and the control signal to the semiconductor memory device 1, wherein the control signal includes the read command and the write command for loopback operation. In the time period T112, the semiconductor memory device 1 reads the test data out of the memory 12 and then stores the test data as read into a new memory area designated by the address signal that is included in the write command.

In a time period T113, the tester 90 supplies the supplies the lower-frequency clock signal and the control signal to the semiconductor memory device 1, wherein the control signal includes the read command. The lower-frequency clock signal is lower in frequency than the clock signal. The semiconductor memory device 1 reads the test data out of the memory 12 4-bits by 4-bits, wherein the test data had been written by the loopback operation. The data is then supplied to the tester 90. The tester 90 determines whether the data as read out correspond to a predetermined set of expected values, thereby detecting any failure of the semiconductor memory device 1. The test data is read out of the memory 12 and supplied from the semiconductor memory device 1 to the tester 90 through the buffer register of the loopback circuit 14 4-bits by 4-bits.

Figure 7A:
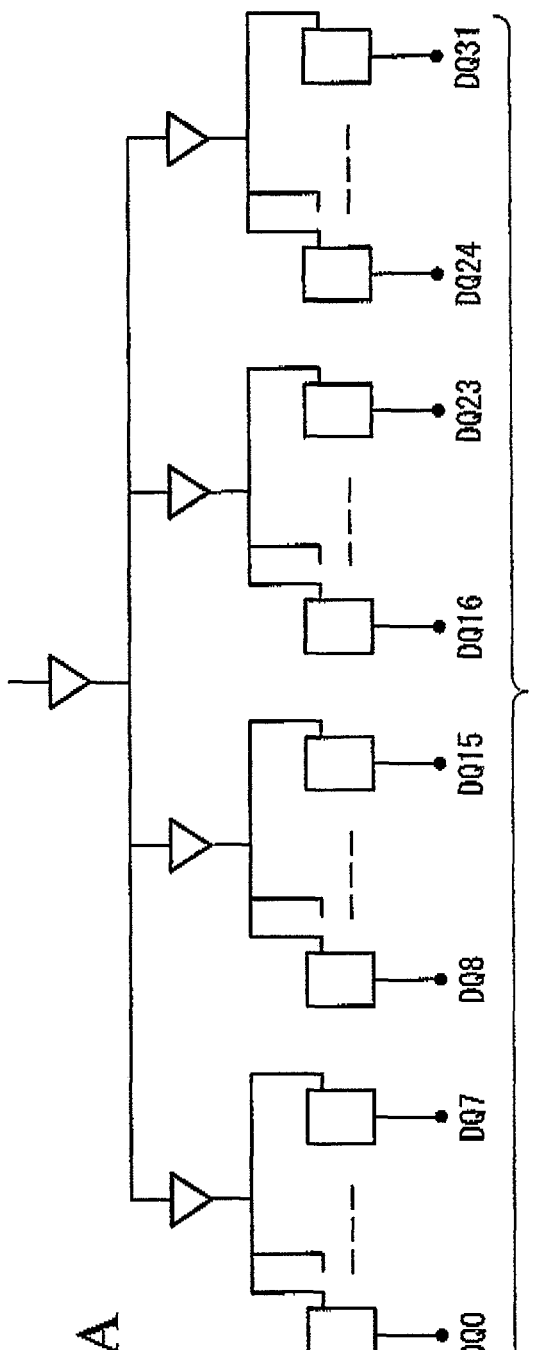
FIG. 7A is a clock tree structure for supplying the clock signal to logic devices that are connected to the data input/output terminals in the semiconductor memory device of FIG. 1.

A method of selecting terminals in the data input/output terminals 17 for connecting the semiconductor memory device 1 to the tester 90 will be described. FIG. 7A is a clock tree structure for supplying the clock signal to logic devices that are connected to the data input/output terminals 17 in the semiconductor memory device 1. In the clock tree structure, the number of stages of buffers coupled to the clock signal is uniform, and the number of the data input/output terminals coupled to the clock signal is uniform. The data input/output terminals 17 are grouped so that every eight data input/output terminals 17 makes a group. The grouped eight data input/output terminals 17 are not largely different in AC timing or the delay time. This makes it easier to adjust or control the delay time or AC timing until a transition of the clock signal propagates to each data input/output terminal, thereby making it easier to design the semiconductor memory device 1.

Figure 7B:
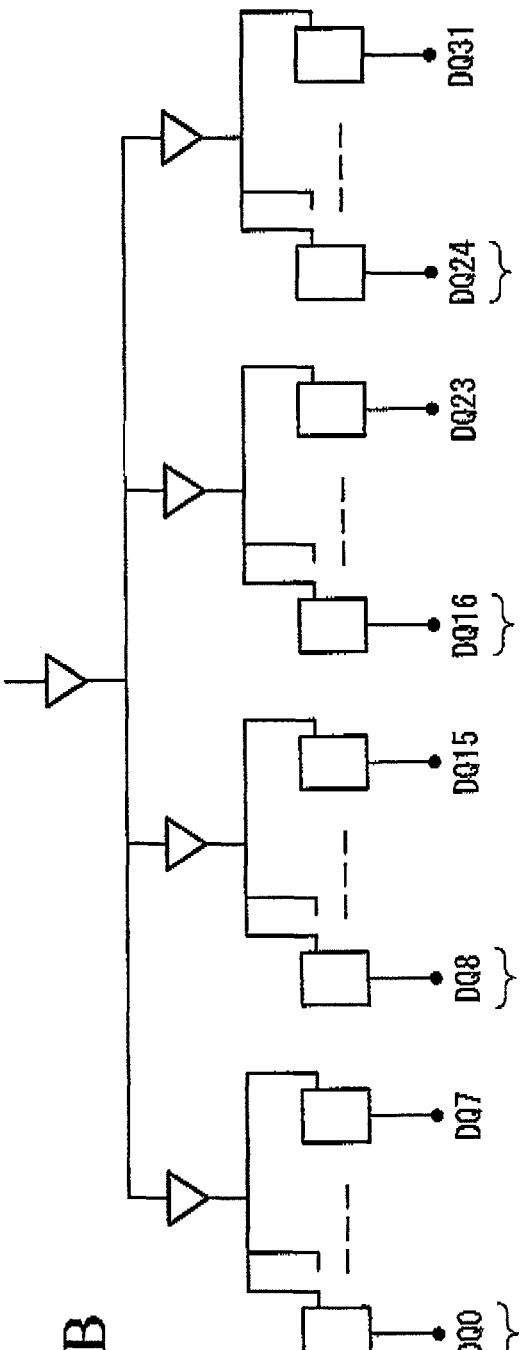
FIG. 7B is a clock tree structure for supplying the clock signal to logic devices that are connected to the data input/output terminals in the semiconductor memory device of FIG. 1.

FIG. 7B is a clock tree structure for supplying the clock signal to logic devices that are connected to the data input/output terminals 17 in the semiconductor memory device 1. A data input/output terminal 17 to be connected to the tester 90 is selected from every group of the eight data input/output terminals 17, wherein the eight data input/output terminals 17 making each group commonly share the same clock buffer in the final stage. Namely, the selected data input/output terminals 17 are connected to different clock buffers in the final stage for the clock signal that is supplied to logic elements coupled to the data input/output terminals. For example, data input/output terminals DQ0, DQ8, DQ16, and DQ24 are selected as the terminals to be connected to the tester 90. This makes it possible to measure the AC timing for each clock tree. This method of selecting the data input/output terminals allows measurement of AC timing of every clock tree even under the condition of reducing the number of the selected data input/output terminals 17 to be connected to the tester 90, thereby making it possible to detect variation in AC timing of each clock tree.

As described above, the method of selecting the data input/output terminals 17 to be connected to the tester 90 is made based on the clock tree structure that distributes the clock signal.

Second Embodiment

Figure 8:
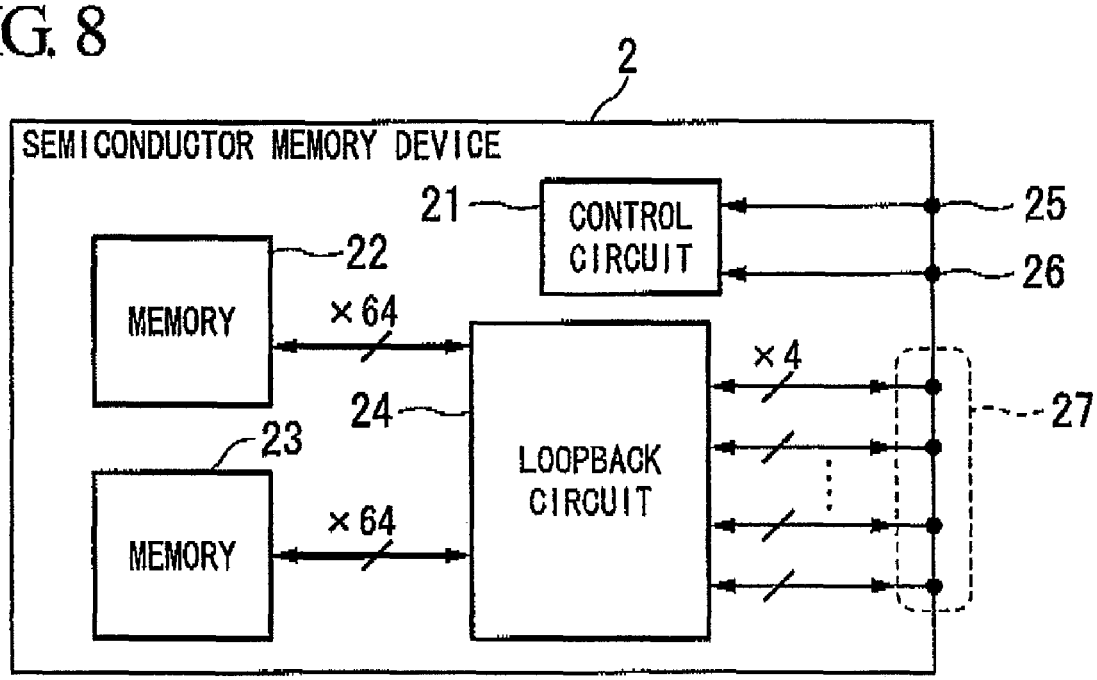
FIG. 8 is a block diagram illustrating a semiconductor memory device in accordance with a second preferred embodiment of the present invention.

FIG. 8 is a block diagram illustrating a semiconductor memory device 2 in accordance with a second preferred embodiment of the present invention. A semiconductor memory device 2 may include, but is not limited to, a control circuit 21, first and second memories 22 and 23, a loopback circuit 24, a clock signal input terminal 25 to which a clock signal is input, a control signal terminal 26 to which a control signal is input and data input/output terminals 27 for 32-bits data.

In the semiconductor memory device 2, the control circuit 21 controls read/write operations of reading or writing data into the first and second memories 22 and 23, so that the read/write operations are synchronized with the clock signal that has been input through the clock signal input terminal 25, and that the write operations are performed in accordance with the control signal that include an address signal, wherein the control signal has been input through the control signal terminal 26. In some cases, the control signal may include, but is not limited to, a chip select signal, a row address strobe signal, a column address strobe signal, and a write enable signal. The control circuit 21 controls the loopback circuit 24.

Data supplied from the loopback circuit 24 are stored into a designated area of the first memory 22, wherein the designated area has been designated by the control circuit 21. The stored data are then read out of the designated area of the first memory 22 and then the read data are input into the loopback circuit 24. Data supplied from the loopback circuit 24 are stored into a designated area of the second memory 23, wherein the designated area has been designated by the control circuit 21. The stored data are then read out of the designated area of the second memory 23, and then the read data are input into the loopback circuit 24. Each of the first and second memories 22 and 23 has an output terminal for 64-bits, a row address decoder, and a column address decoder, so that the first and second memories 22 and 23 can perform the read and write operations independently.

The loopback circuit 24 receives an input of data of 32-bits from the data input/output terminals 27, wherein the input of the data of 32-bits is synchronized with the rising edge of the clock signal. The loopback circuit 24 receives an input of data of other 32-bits from the data input/output terminals 27, wherein the input of the other data of 32-bits is synchronized with the falling edge of the clock signal. The loopback circuit 24 once stores the data of 32-bits and the other 32-bits and generates a set of data of 64-bits from the data of 32-bits and the other 32-bits. The loopback circuit 24 outputs the set of data of 64-bits that is supplied to the first and second memories 22 and 23, wherein the output of the data of 64-bits is synchronized with the falling edge of the clock signal. The control circuit 21 determines whether the loopback circuit 24 supplies the data of 64-bits to the first memory 22 or the second memory 23 in accordance with the address signal included in the write command.

The loopback circuit 24 receives an input of data of 64-bits from the memory 22 or 23, wherein the input of data of 64-bits is synchronized with the falling edge of the clock signal. The loopback circuit 24 divides the data of 64-bits into first and second sets of data of 32-bits. The loopback circuit 24 supplies the first set of data of 32-bits to the data input/output terminals 27 in synchronization with the rising edge of the clock signal. The loopback circuit 24 also supplies the second set of data of 32-bits to the data input/output terminals 27 in synchronization with the falling edge of the clock signal.

The loopback circuit 24 performs loopback operation, wherein the loopback circuit 24 receives the input data of 64-bits from the first or second memory 22 or 23 and then supplies the data of 64-bits to the second or first memory 23 or 22. The loopback circuit 24 performs loopback operation under the control by the control circuit 21. The control circuit 21 controls the loopback operations of the loopback circuit 24. In read operation in test mode to detect failure of the semiconductor memory device 2, the loopback circuit 24 selects sequentially a set of data of 4-bits in the data of 64-bits that has been input from the first memory 22, and then output the selected set of data of 4-bits through a previously selected set of four terminals of the data input/output terminals 27.

The loopback circuit 24 has two loopback blocks 100, each of which has been described with reference to FIG. 2. Each loopback block 100 has internal data input/output terminals 114 and 115 which are connected to the first and second memories 22 and 23, respectively. Each loopback block 100 has the data input/output terminal 112 that is commonly connected to the data input/output terminals 27.

The semiconductor memory device 2 has the two memories 22 and 23 which allow independent or separate operations of reading writing data, in view of which the semiconductor memory device 2 is different from the above-described semiconductor memory device 1 that has been described with reference to FIG. 1.

Figure 9A:
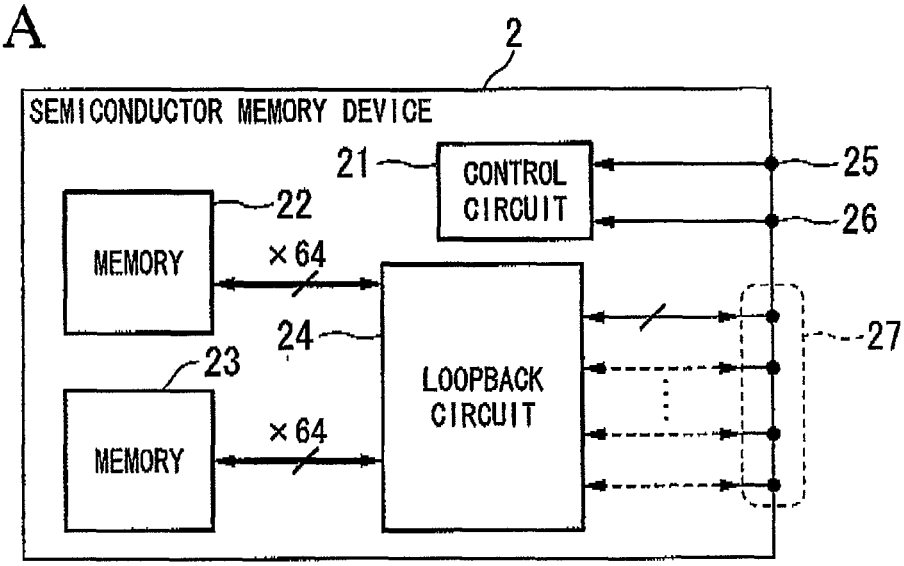
FIG. 9A is a block diagram illustrating test operations of the semiconductor memory device of FIG. 8.

Operations of the semiconductor memory device 2 will be described. FIG. 9A is a block diagram illustrating test operations of the semiconductor memory device 2 of FIG. 8. The semiconductor memory device 2 is connected to the tester 90. The semiconductor memory device 2 receives an input of the clock signal through the clock signal input terminal 25 from the tester 90. The semiconductor memory device 2 also receives an input of the control signal through the control signal terminal 26 from the tester 90. The semiconductor memory device 2 also receives an input of test data through the selected set of four data input/output terminals 27 from the tester 90. The four selected data input/output terminals 27 are connected to four I/O terminals of the tester 90. In FIG. 9A, the semiconductor memory device 2 is subjected to an operation test, in which data input and output are made through a selected set of four terminals in the data input/output terminals 27. The selected set of four terminals is thus used commonly for operation test. In FIG. 9A, the broken-line arrow marks between the loopback circuit 24 and the data input/output terminals 27 represent no input/output of any valid data. The real-line arrow mark between the loopback circuit 24 and the data input/output terminals 27 represents effective input and output of data of 4-bits through the selected set of four terminals 27.

Figure 9B:
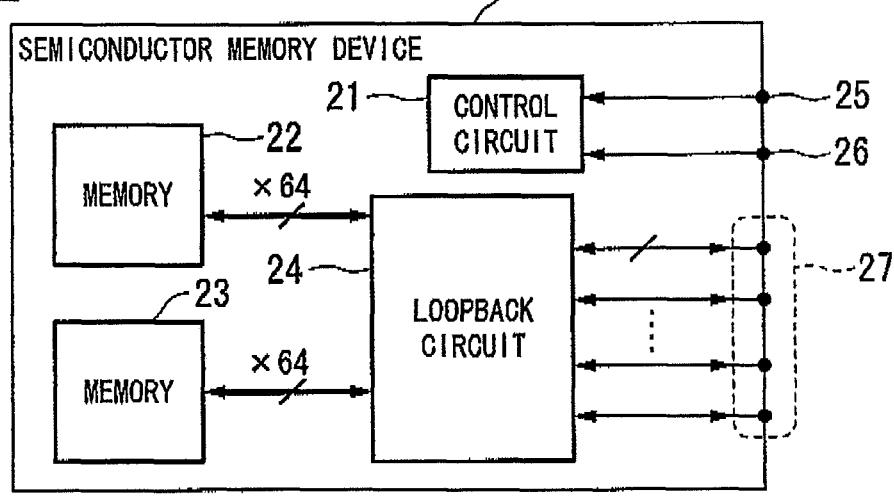
FIG. 9B is a block diagram illustrating normal operations of the semiconductor memory device of FIG. 8.

FIG. 9B is a block diagram illustrating normal operations of the semiconductor memory device 2 of FIG. 8. In FIG. 9B, the semiconductor memory device 2 is subjected to the normal operation, in which data input and output are made through all of the data input/output terminals 27. The real-line arrow marks between the loopback circuit 24 and the data input/output terminals 27 represent that data input and output are made through all of the data input/output terminals 27.

Figure 9C:
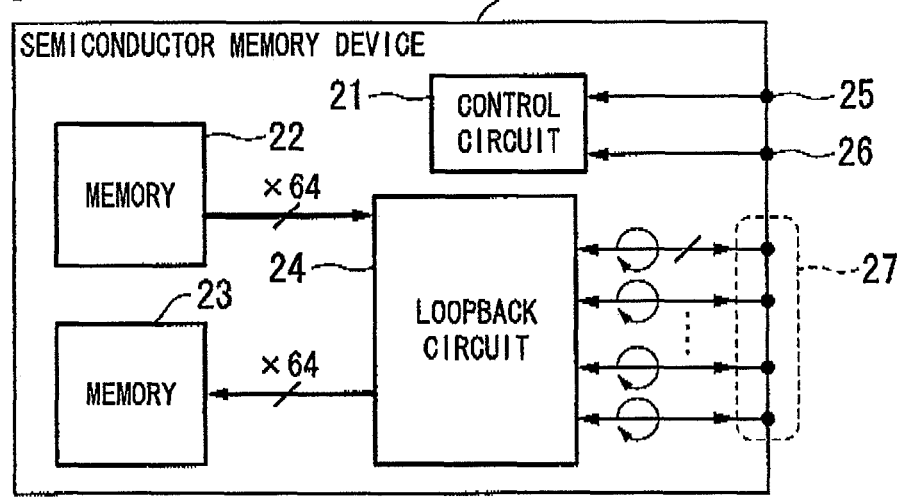
FIG. 9C is a block diagram illustrating loopback operations of the semiconductor memory device of FIG. 8.

FIG. 9C is a block diagram illustrating loopback operations of the semiconductor memory device 2 of FIG. 8. In FIG. 9C, the semiconductor memory device 2 is subjected to a loopback operation in test mode, in which a set of data of 64-bits is read out of the first memory 22 and then the read set of data of 64-bits is then stored into the second memory 23. The loopback circuit 24 performs loopback operation, without making input and output of data through the data input/output terminals 27.

Also, the semiconductor memory device 2 is subjected to another loopback operation in test mode, in which a set of data of 64-bits is read out of the second memory 23 and then the read set of data of 64-bits is then stored into the first memory 22. The loopback circuit 24 performs the other loopback operation, without making input and output of data through the data input/output terminals 27.

Figure 10A:
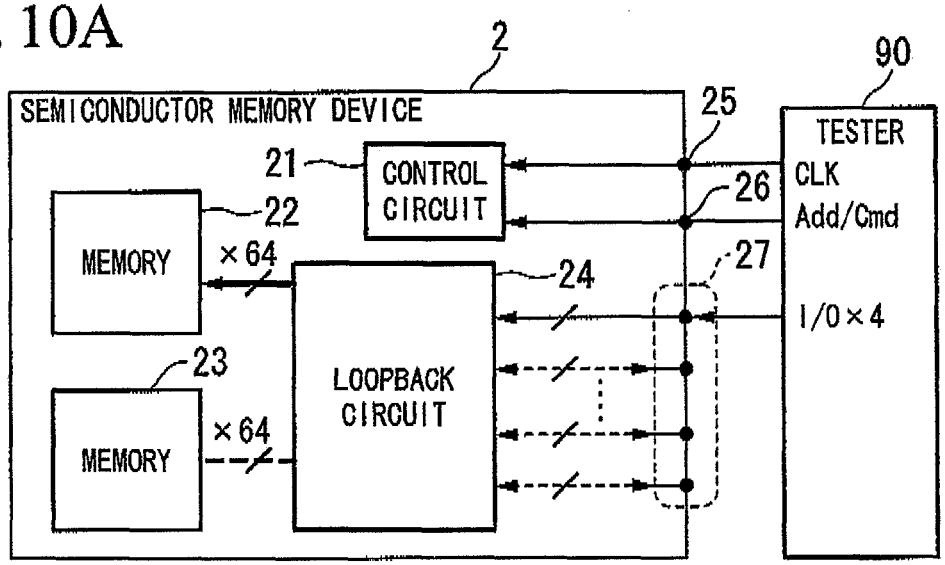
FIG. 10A is a block diagram illustrating write operation of writing test data from a tester to the semiconductor memory device in accordance with the test method for the semiconductor memory device of FIG. 8.

Operations in the test mode of the semiconductor memory device 2 will be described. FIG. 10A is a block diagram illustrating write operation of writing test data from a tester 90 to the semiconductor memory device 2 in accordance with the test method for the semiconductor memory device 2 of FIG. 8. The semiconductor memory device 2 is connected to the tester 90. The semiconductor memory device 2 receives an input of the clock signal through the clock signal input terminal 25 from the tester 90. The semiconductor memory device 2 also receives an input of the control signal through the control signal terminal 26 from the tester 90. The semiconductor memory device 2 also receives an input of test data through the selected set of four data input/output terminals 27 from the tester 90. The four selected data input/output terminals 27 are connected to the four I/O terminals of the tester 90.

The tester 90 sequentially supplies the semiconductor memory device 2 with test data 4-bits by 4-bits to be written into a write area "Write Area" of the first memory 22, wherein the write area "Write Area" is designated by the address signal included in the control signal.

Figure 10B:
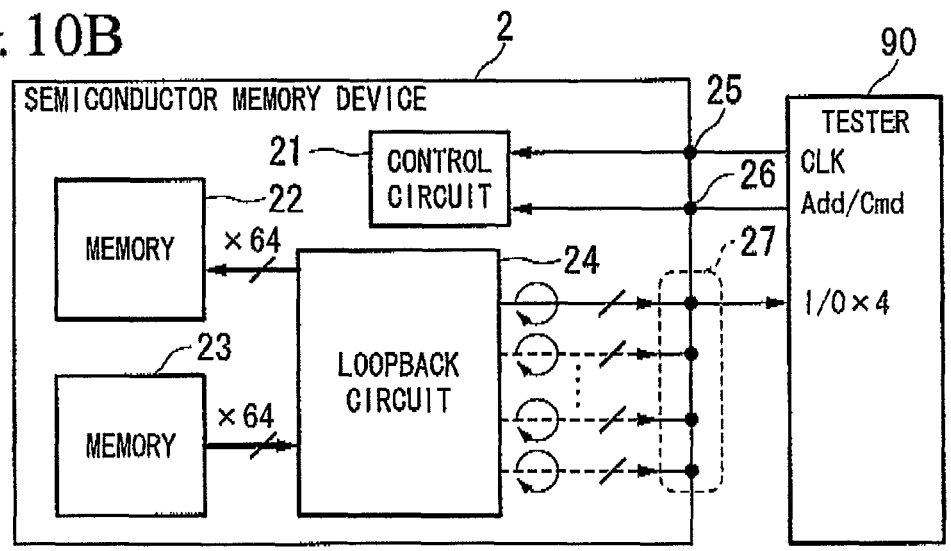
FIG. 10B is a block diagram illustrating loopback operation of the loopback circuit in the semiconductor memory device in accordance with the test method for the semiconductor memory device of FIG. 8.

FIG. 10B is a block diagram illustrating loopback operation of the loopback circuit 24 in the semiconductor memory device 2 in accordance with the test method for the semiconductor memory device 2 of FIG. 8. After the write operation of writing the test data has been completed, the tester 90 supplies, through the control signal terminal 26, the burst read command "Burst Read" for the first memory 22 and the burst write command "Burst Write" for the second memory 23 through the control signal input terminal 26 into the semiconductor memory device 2. The control circuit 21 controls the loopback circuit 24 in performing loopback operation so as to burst-read the test data out of the first memory 22 and then to burst-write the burst-read data into the second memory 23.

Figure 10C:
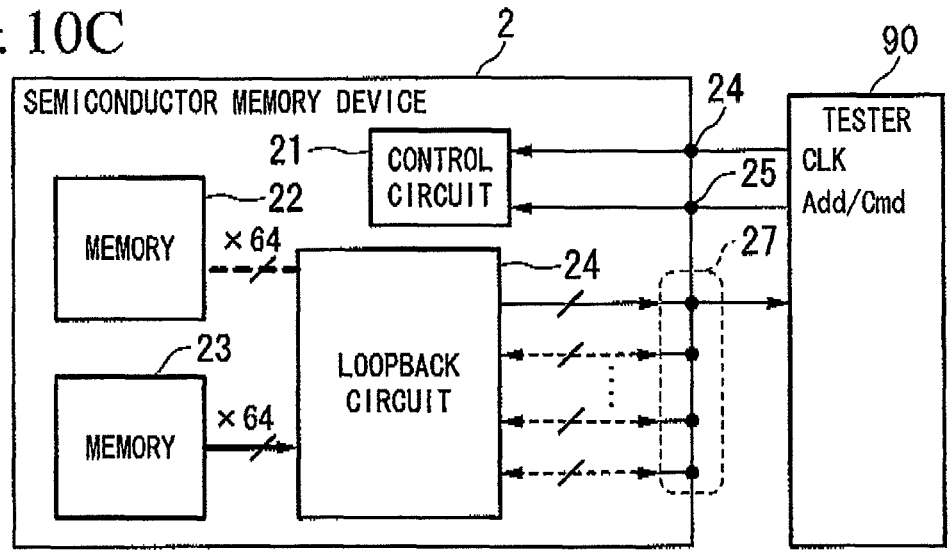
FIG. 10C is a block diagram illustrating read operation of reading the test data from the second memory in the semiconductor memory device in accordance with the test method for the semiconductor memory device of FIG. 8.

FIG. 10C is a block diagram illustrating read operation of reading the test data from the second memory 23 in the semiconductor memory device 2 in accordance with the test method for the semiconductor memory device 2 of FIG. 8. The tester 90 supplies the read command "Read" for test to the semiconductor memory device 2 through the control signal input terminal 26, so that the test data that had been written by the loopback operation is read out of the second memory 23, and the test data is supplied to the tester 90. The tester 90 determines whether the data as read out correspond to a predetermined set of expected values, thereby detecting any failure of the semiconductor memory device 2.

The semiconductor memory device 2 is different from the semiconductor memory device 1 in that the semiconductor memory device 2 has the first and second memories 22 and 23, each of which allows independent access thereto. The loopback operation is performed so as to perform a burst read operation of burst-reading the test data out of one of the first and second memories 22 and 23, and then to perform a burst write operation of burst-writing the burst-read test data into another of the first and second memories 22 and 23. This loopback operation can reduce the number of clock cycles that need to write test data, thereby reducing the time and cost that are necessary for performing the test operation.

Third Embodiment

Figure 11:
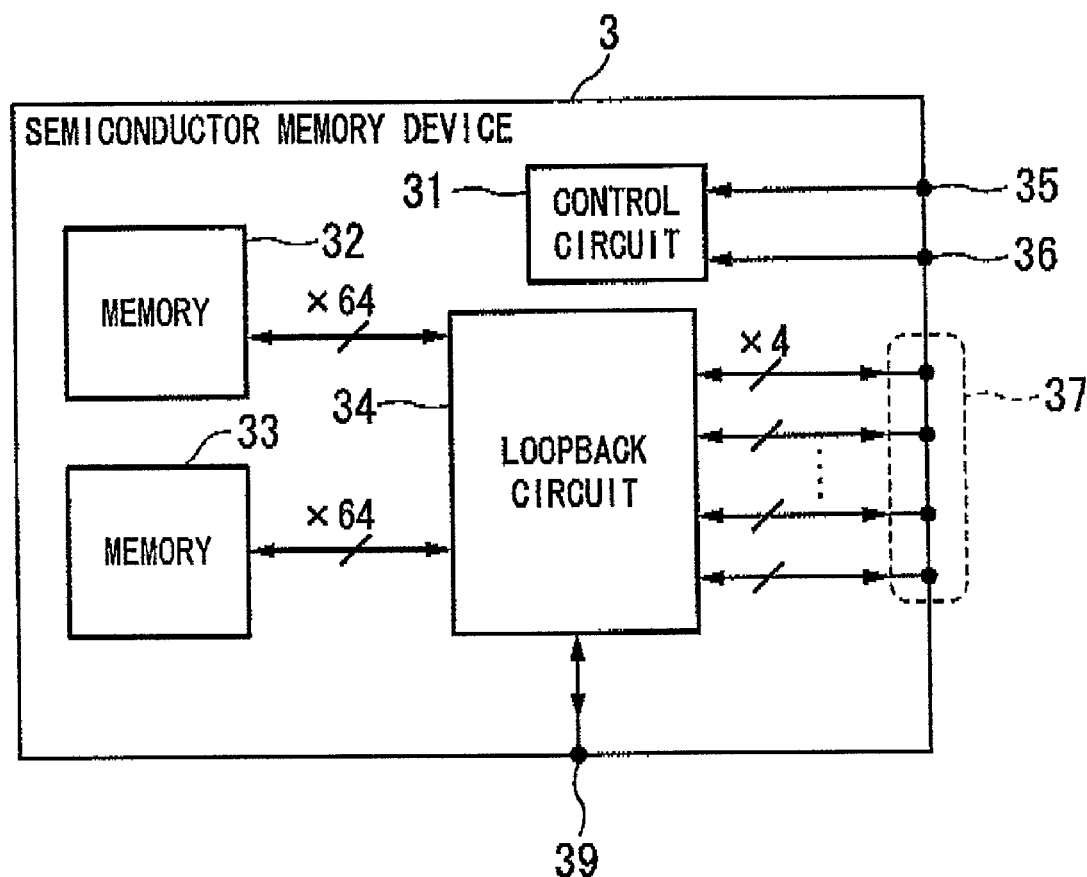
FIG. 11 is a block diagram illustrating a semiconductor memory device in accordance with a third preferred embodiment of the present invention.

FIG. 11 is a block diagram illustrating a semiconductor memory device 3 in accordance with a third preferred embodiment of the present invention. A semiconductor memory device 3 may include, but is not limited to, a control circuit 31, first and second memories 32 and 33, a loopback circuit 34, a clock signal input terminal 35 to which a clock signal is input a control signal terminal 36 to which a control signal is input, data input/output terminals 37 for 32-bits data, and a test data terminal 39 that is dedicated to allow input and output of test data.

In the semiconductor memory device 3, the control circuit 31 controls read/write operations of reading or writing data into the first and second memories 32 and 33, so that the read/rite operations are synchronized with the clock signal that has been input through the clock signal input terminal 35, and that the read/write operations are performed in accordance with the control signal that include an address signal, wherein the control signal has been input through the control signal terminal 36. In some cases, the control signal may include, but is not limited to, a chip select signal, a row address strobe signal, a column address strobe signal, and a write enable signal. The control circuit 31 controls the loopback circuit 34, Data supplied from the loopback circuit 34 are stored into a designated area of the first memory 32, wherein the designated area has been designated by the control circuit 31. The stored data are then read out of the designated area of the first memory 32 and then the read data are input into the loopback circuit 34. Data supplied from the loopback circuit 34 are stored into a designated area of the second memory 33, wherein the designated area has been designated by the control circuit 31. The stored data are then read out of the designated area of the second memory 33, and then the read data are input into the loopback circuit 34. Each of the first and second memories 32 and 33 has an output terminal for 64-bits, a row address decoder, and a column address decoder, so that the first and second memories 32 and 33 can perform the read and write operations independently.

The loopback circuit 34 receives an input of data of 32-bits from the data input/output terminals 37, wherein the input of the data of 32-bits is synchronized with the rising edge and the falling edge of the clock signal. The loopback circuit 34 receives an input of data of other 32-bits from the data input/output terminals 37, wherein the input of the other data of 32-bits is synchronized with the falling edge of the clock signal. The loopback circuit 34 once stores the data of 32-bits and the other 32-bits and generates a set of data of 64-bits from the data of 32-bits and the other 32-bits. The loopback circuit 34 outputs the set of data of 64-bits, wherein the output of the data of 64-bits is synchronized with the falling edge of the clock signal. The control circuit 31 determines whether the loopback circuit 34 supplies the data of 64-bits to the first memory 32 or the second memory 33 in accordance with the address signal included in the write command.

The loopback circuit 34 receives an input of data of 64-bits from the memory 32 or 33, wherein the input of data of 64-bits is synchronized with the falling edge of the clock signal. The loopback circuit 34 divides the data of 64-bits into first and second sets of data of 32-bits. The loopback circuit 34 supplies the first set of data of 32-bits to the data input/output terminals 37 in synchronization with the rising edge of the clock signal. The loopback circuit 34 also supplies the second set of data of 32-bits to the data input/output terminals 37 in synchronization with the falling edge of the clock signal.

The loopback circuit 34 has a buffer register that is used for writing and reading test data. The loopback circuit 34 is connected to test data terminal 39, so that the loopback circuit 34 performs input and output of test data for operation test through the test data terminal 39. The loopback circuit 34 performs loopback operation, wherein the loopback circuit 34 receives the input data of 64-bits from the first or second memory 32 or 33 and then supplies the data of 64-bits to the second or first memory 33 or 32. The loopback circuit 34 performs loopback operation under the control by the control circuit 31. The control circuit 31 controls the loopback operations of the loopback circuit 34.

The loopback circuit 34 has two loopback blocks 100, each of which has been described with reference to FIG. 2. Each loopback block 100 has internal data input/output terminals 114 and 115 which are connected to the first and second memories 33 and 34, respectively. Each loopback block 100 has the data input/output terminal 112 that is commonly connected to the data input/output terminals 37.

The semiconductor memory device 3 has two memories 32 and 33 which allow independent or separate operations of reading writing data, in view of which the semiconductor memory device 3 is different from the above-described semiconductor memory device 1.

The semiconductor memory device 3 uses the test data terminal 39 in performing input and output of test data, without using the data input/output terminals 37, in view of which the semiconductor memory device 3 is different from the above-described semiconductor memory device 2.

Figure 12A:
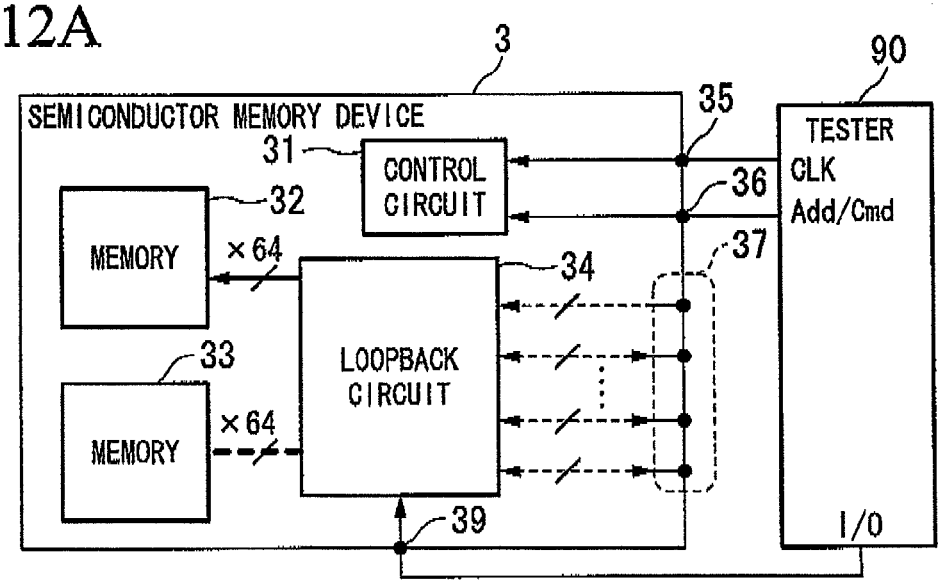
FIG. 12A is a block diagram illustrating write operation of writing test data from a tester to the semiconductor memory device in accordance with the test method for the semiconductor memory device of FIG. 11.

Operations in the test mode of the semiconductor memory device 3 will be described. FIG. 12A is a block diagram illustrating write operation of writing test data from a tester 90 to the semiconductor memory device 3 in accordance with the test method for the semiconductor memory device 3 of FIG. 11. The semiconductor memory device 3 is connected to the tester 90. The semiconductor memory device 3 receives an input of the clock signal through the clock signal input terminal 35 from the tester 90. The semiconductor memory device 3 also receives an input of the control signal through the control signal terminal 36 from the tester 90. The semiconductor memory device 3 also receives an input of test data through the test data terminal 39 from the tester 90. The test data terminal 39 is connected to the four I/O terminals of the tester 90.

The tester 90 sequentially supplies the semiconductor memory device 3 with test data 1-bit by 1-bit to be written into a write area "Write Area" of the first memory 32, wherein the write area "Write Area" is designated by the address signal included in the control signal.

Figure 12B:
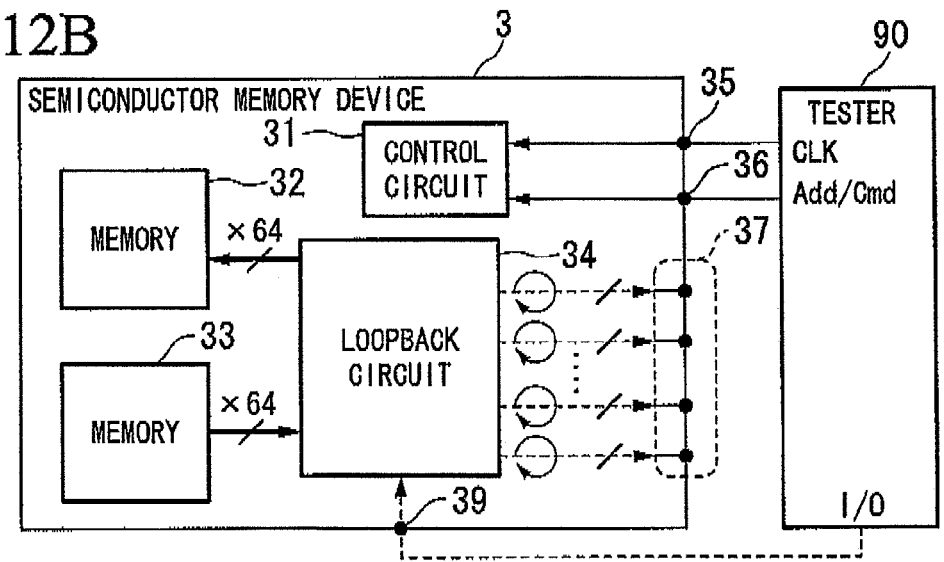
FIG. 12B is a block diagram illustrating loopback operation of the loopback circuit in the semiconductor memory device in accordance, with the test method for the semiconductor memory device of FIG. 11.

FIG. 12B is a block diagram illustrating loopback operation of the loopback circuit 34 in the semiconductor memory device 3 in accordance with the test method for the semiconductor memory device 3 of FIG. 11. After the write operation of writing the test data has been completed, the tester 90 supplies, through the control signal terminal 36, the burst read command "Burst Read" for the first memory 32 and the burst write command "Burst Write" for the second memory 33 through the control signal input terminal 36 into the semiconductor memory device 3. The control circuit 31 controls the loopback circuit 34 in performing loopback operation so as to burst-read the test data out of the first memory 32 and then to burst-write the burst-read data into the second memory 33.

Figure 12C:
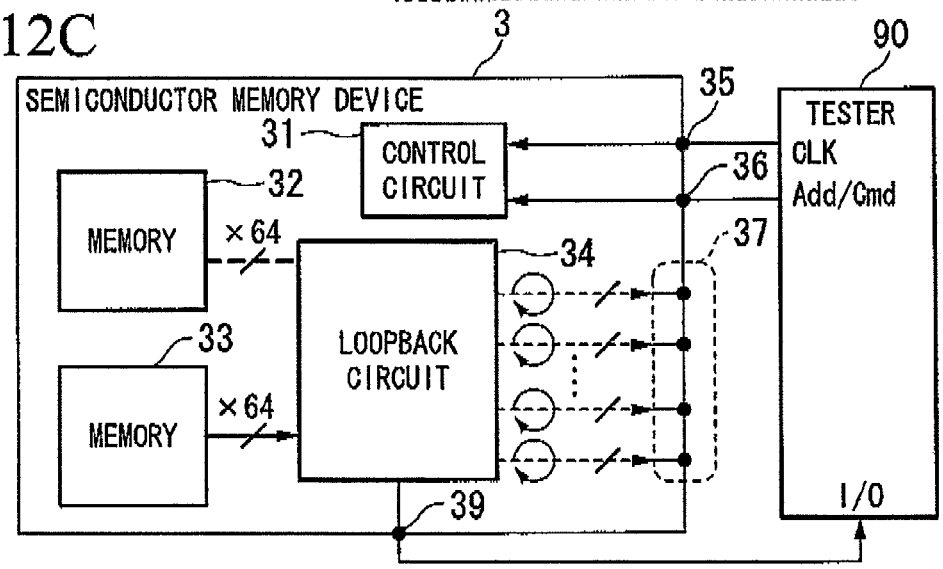
FIG. 12C is a block diagram illustrating read operation of reading the test data from the second memory in the semiconductor memory device in accordance with the test method for the semiconductor memory device of FIG. 11.

FIG. 12C is a block diagram illustrating read operation of reading the test data from the second memory 33 in the semiconductor memory device 3 in accordance with the test method for the semiconductor memory device 3 of FIG. 11. The tester 90 supplies the read command "Read" for test to the semiconductor memory device 3 through the control signal input terminal 36, so that the test data that had been written by the loopback operation is read out of the second memory 33, and the test data is supplied to the tester 90. The tester 90 determines whether the data as read out correspond to a predetermined set of expected values, thereby detecting any failure of the semiconductor memory device 3. The test data to be read out is once stored in the buffer register and then outputted through the test data terminal.

Figure 13:
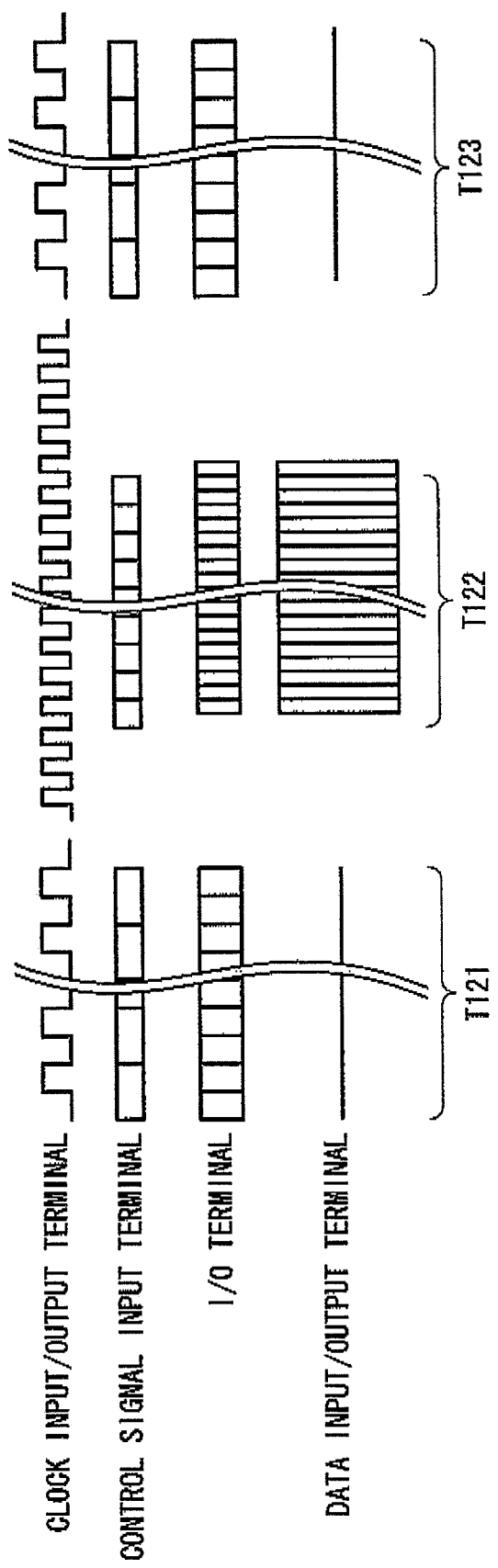
FIG. 13 is a diagram illustrating an example of the test operations for the semiconductor memory device of FIG. 11 by using the tester.
Figure 14:
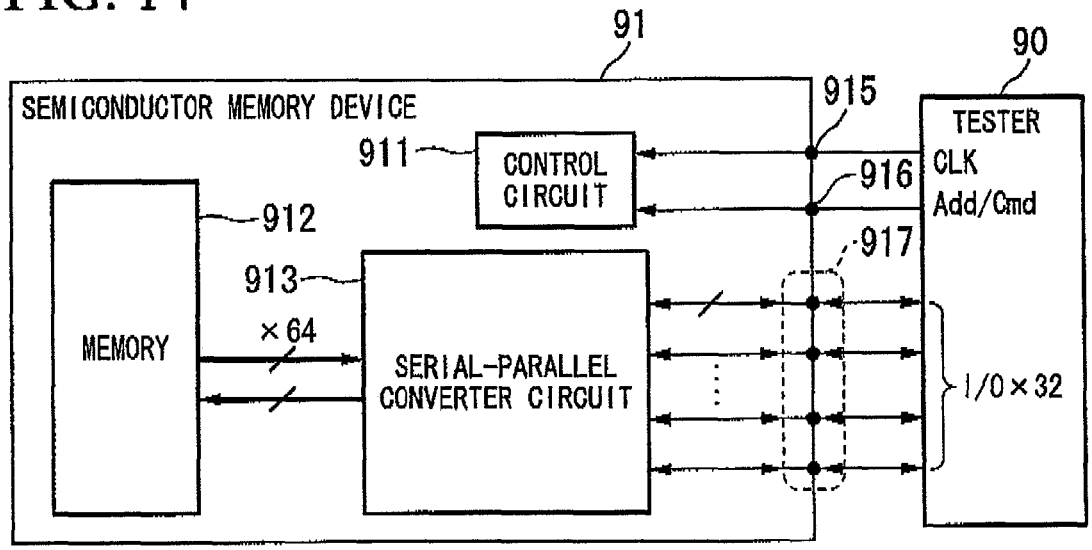
FIG. 14 is a schematic diagram illustrating a semiconductor memory device and a tester which is connected to the semiconductor memory device in accordance with the related art.
Figure 15:
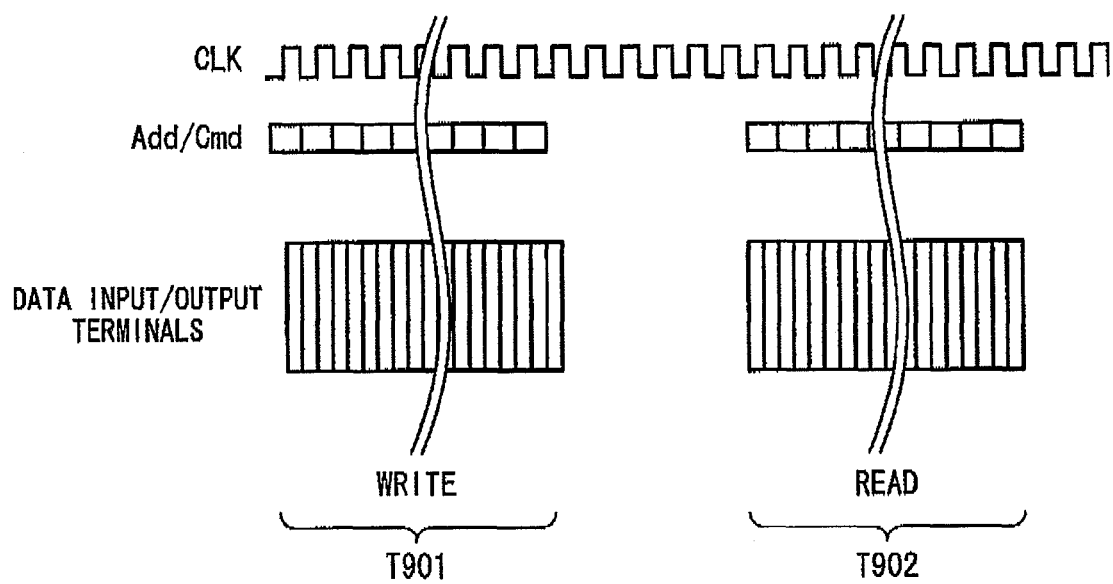
FIG. 15 is a schematic diagram illustrating test operation for the semiconductor memory device using the tester in accordance with the related art.
Figure 16:
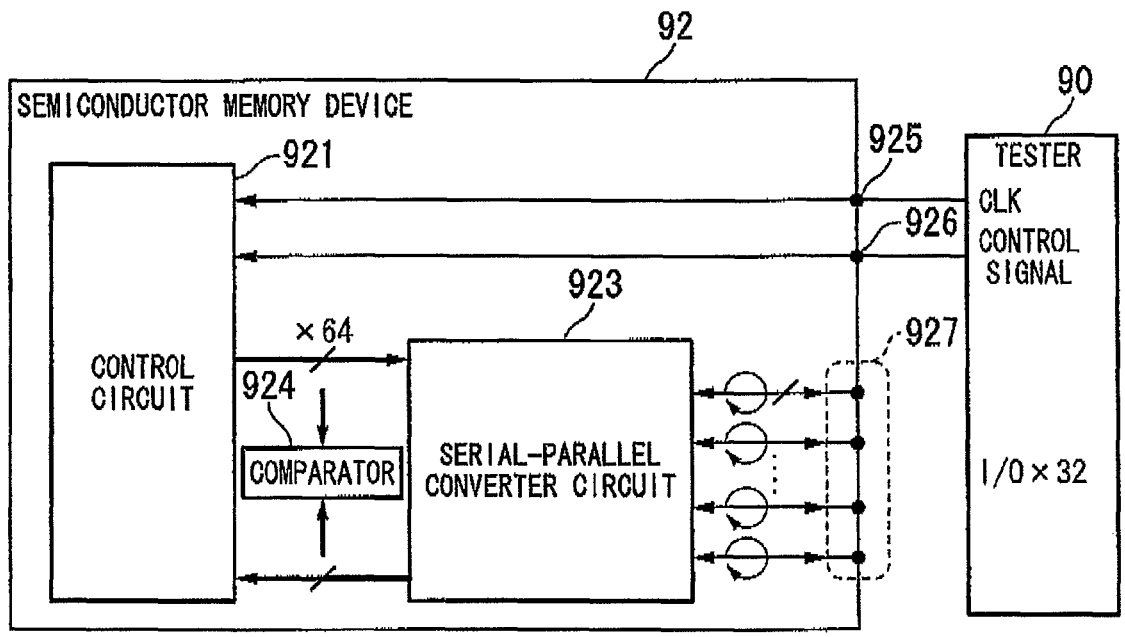
FIG. 16 is a schematic diagram illustrating a semiconductor circuit and a tester which is connected to the semiconductor circuit in accordance with the related art.
Figure 17:
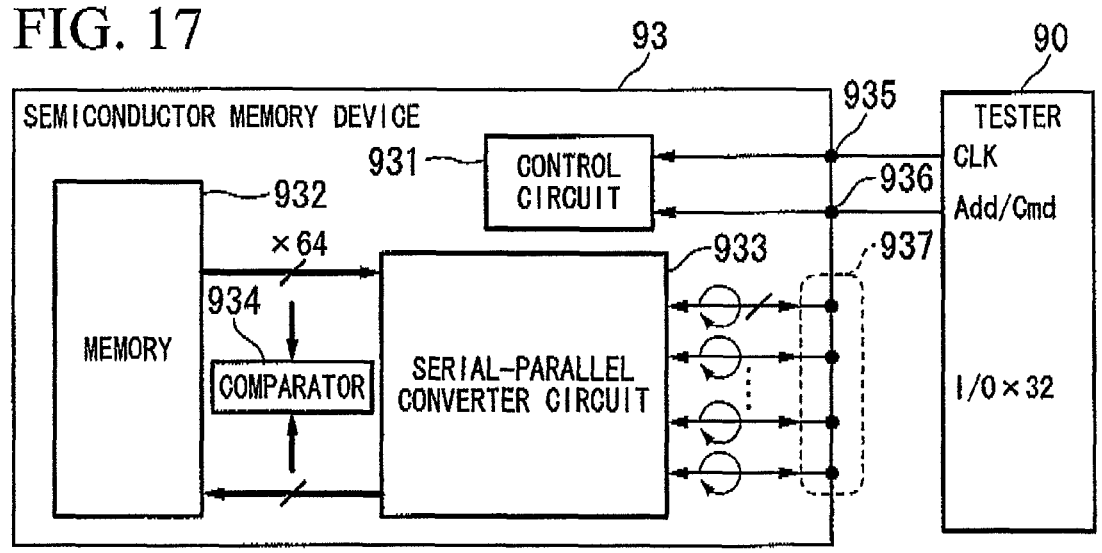
FIG. 17 is a schematic diagram illustrating a semiconductor circuit and a tester which is connected to the semiconductor circuit in accordance with the related art.

FIG. 13 is a diagram illustrating an example of the test operations for the semiconductor memory device 3 by using the tester 90. It is possible that the test operation can be performed using clock signals that are lower in frequency than the clock signal that is used for performing the real operations, thereby allowing the test operation without using any advanced tester that has input/output terminals for high speed and highly accurate operations. For example, different clock signals are used in writing and reading the test data from the clock signal that is used for the real operation. The different clock signals for writing and reading the test data are lower in frequency than the clock signal that is used for the real operation. In the time periods T121 and T123, the tester 90 supplies the semiconductor memory device 3 with the clock signal that is lower in frequency than the clock signal that is supplied in the time period T122.

In the time period T121, the tester 90 supplies the control signal including the write command and the lower-frequency clock signal to the semiconductor memory device 3. The tester 90 also supplies test data to the semiconductor memory device 3 through the test data terminal 39 so that the semiconductor memory device 3 writes the test data therein.

In the time period T122, the tester 90 supplies the clock signal that is higher in frequency than the lower-frequency clock and the control signal to the semiconductor memory device 3, wherein the control signal includes the read command and the write command for loopback operation. In the time period T122, the semiconductor memory device 3 reads the test data out of the first memory 32 and then stores the test data as read into the second memory 33.

In a time period T123, the tester 90 supplies the supplies the lower-frequency clock signal and the control signal to the semiconductor memory device 3, wherein the control signal includes the read command. The lower-frequency clock signal is lower in frequency than the clock signal. The semiconductor memory device 3 reads the test data out of the second memory 33, wherein the test data had been written by the loopback operation. The data is then supplied to the tester 90. The tester 90 determines whether the data as read out correspond to a predetermined set of expected values, thereby detecting any failure of the semiconductor memory device 3.

The semiconductor memory device 3 is different from the semiconductor memory devices 1 and 2 so that the semiconductor memory device 3 has the test data terminal 39 that is dedicated to allow the semiconductor memory device 3 to be tested without using the data input/output terminals 37. Using the test data terminal 39 makes it unnecessary to provide any circuit for operation test, thereby making it easier that the load to each of the data input/output terminals 37 is uniform. This makes it easier to avoid any substantive difference of AC timing between the data input/output terminals 37. The transfer of test data between the semiconductor memory device 3 and the tester 90 may be slower than the real operation speed of the semiconductor memory device 3.

In accordance with the above-described first to third embodiments, it is possible to reduce the number of the necessary I/O terminals of the tester for connection to the semiconductor memory device, thereby increasing the number of the semiconductor memory devices that are coupled to the tester for performing the operation tests for the semiconductor memory devices simultaneously.

In accordance with the above-described first to third embodiments, it is possible to perform test operation of the semiconductor memory device at the high speed such as the real operation speed, while the data transfer between the semiconductor memory device and the tester is slower than the test operation of the semiconductor memory device. As a result, it is necessary for a tester to supply the clock signal having an intended high frequency to the semiconductor memory device, in order to perform the test operation at high speed, with performing lower speed transfer of test data to the semiconductor memory device. The above-described method allows the advanced semiconductor memory device to be tested by using a non-advanced cheaper tester that is incapable of transferring, at lower speed, test data to the semiconductor memory device. The above-described method is effective to reduce the cost for the semiconductor memory device by using the non-advanced cheaper tester.

The semiconductor memory device has the loopback circuit that performs loopback operation not only in the test operation mode but also in the normal operation mode, so that the semiconductor memory device reads a set of data out of a memory area and then writes the set of data into a different memory area without using any external device. The loopback circuit can reduce the clock cycles that need to perform copying a set of data that is stored in a memory area to a different memory area.

In some cases, the semiconductor memory device may be, but is not limited to, DDR-SDRAM and SD-RAM.

It is apparent that the present invention is not limited to the above embodiments, but may be modified and changed without departing from the scope and spirit of the invention.

What is claimed is:

1. A semiconductor memory device comprising:
   a memory that stores data;
   an input/output unit that inputs and outputs data of a predetermined number of bits in synchronization with a clock signal, the input/output unit comprising the same number of data input/output terminals as the predetermined number of bits; and
   a loopback circuit that performs loopback operation to read data of the predetermined number of bits out of a first area of the memory and to write the data read from the first area of the memory into a second area of the memory.

2. The semiconductor memory device according to claim 1, wherein a selected set of terminals of the data input/output terminals is commonly used in not only normal mode but also test mode.

3. The semiconductor memory device according to claim 2, wherein the selected set of terminals are connected to different clock buffers in the final stage for the clock signal that is supplied to logic elements coupled to the data input/output terminals.

4. The semiconductor memory device according to claim 1, further comprising:
   a test data terminal that is different from the data input/output terminals, the test data terminal being dedicated to allow input and output of test data in test mode.

5. The semiconductor memory device according to claim 1, wherein the memory comprises a plurality of memory blocks that each allow independent read/write operation for data of the predetermined number of bits from each other, and
   the loopback circuit reads data of the predetermined number of bits out of a first one of the plurality of memory blocks and then writes the data into a second one of the plurality of memory blocks.

6. The semiconductor memory device according to claim 1, wherein a read command is input into the semiconductor memory device and then a write command is input into the semiconductor device, before the loopback circuit reads data of the predetermined number of bits out of the first area that is designated by an address included in the read command and then writes the data into the second area that is designated by a different address included in the write command.

7. The semiconductor memory device according to claim 1, wherein the data written to the second area of the memory is read from the second area of the memory and the read data is provided to a tester device for determining whether the data read from the second area of the memory is identical to a predetermined set of expected values.

8. A method of performing a test for a semiconductor memory device, the method comprising:
performing a loopback operation to read test data of a predetermined number of bits out of a first area of a memory and to write the test data, read from the first area of the memory, into a second area of the memory;
reading the test data, written to the second area of the memory, out of the second area of the memory; and
determining whether the test data, read out of the second area of the memory, are identical to a predetermined set of expected values to detect failure of the semiconductor memory device.

9. The method according to claim 8, further comprising:
supplying the test data to a tester through a selected set of terminals of data input/output terminals of the semiconductor memory so that the tester determines whether the test data are identical to the predetermined set of expected values,
wherein the number of the data input/output terminals is the same as the predetermined number of bits, and the number of the terminals belonging to the selected set is smaller than the data input/output terminals.

10. The method according to claim 9, further comprising:
supplying the test data through the selected set of terminals to the semiconductor memory device; and
storing the test data into the first area of the memory prior to performing the loopback operation.

11. The method according to claim 8, further comprising:
supplying the test data to a tester through at least one test data terminal that is different from data input/output terminals of the semiconductor memory so that the tester determines whether the test data are identical to the predetermined set of expected values.

12. The method according to claim 11, further comprising:
supplying the test data through the at least one test data terminal to the semiconductor memory device; and
storing the test data into the first area of the memory prior to performing the loopback operation.

13. The method according to claim 8, further comprising:
supplying the test data to the semiconductor memory device in synchronization with a clock signal having a first frequency that is lower than the second frequency of the clock signal for performing the loopback operation; and
supplying the test data to a tester in synchronization with the clock signal having the first frequency so that the tester determines whether the test data are identical to the predetermined set of expected values.

14. The method according to claim 8, further comprising:
supplying the test data to the semiconductor memory device;
supplying a read command into the semiconductor memory device;
supplying a write command into the semiconductor device after supplying the read command, so that the loopback operation is performed by reading the test data out of the first area that is designated by an address included in the read command and then writing the test data into the second area that is designated by a different address included in the write command.

15. A semiconductor device comprising:
a first memory area;
a control circuit making up first data in response to a plurality of second data, the first data comprising a first number of bits and each of second data comprising a second number of bits that is smaller than the first number, the control circuit writing the bits of the first data into the first memory area in parallel to each other; and
a second memory area;
the control circuit reading out the bits of the first data from the first memory area in parallel to each other to produce third data that comprises the first number of bits, and writing the bits of the third data into the second memory area in parallel to each other.

16. The semiconductor device according to claim 15, the control circuit reading out the bits of the third data from the second memory area in parallel to each other and making up a plurality of fourth data, each, of which comprises the second number of bits, in response to the third data, and
providing each of the fourth data to a tester for determining whether the fourth data is identical to a predetermined set of data to detect failure of the semiconductor device.

17. The semiconductor device according to claim 16, further comprising:
at least one input/output terminal configured so as to input and output each of the second data and each of the fourth data, and internal terminals configured so as to input and output the first data and the third data wherein the number of the internal terminals is larger than that of the input/output terminal.

18. The semiconductor device according to claim 15, further comprising:
a read command that is provided to the semiconductor device,
wherein the control circuit, after a write command is provided to the semiconductor device, reads out the bits of the first data from the first memory in response to receiving the read command , and then writes the bits of the third data into the second memory area in response to receiving the write command.

* * * * *